US012033921B2

(12) United States Patent
Takahashi et al.

(10) Patent No.: US 12,033,921 B2
(45) Date of Patent: Jul. 9, 2024

(54) CABLE CONNECTION STRUCTURE

(71) Applicant: Hitachi Metals, Ltd., Tokyo (JP)

(72) Inventors: Ryuta Takahashi, Tokyo (JP); Hideki Nonen, Tokyo (JP); Yuki Yamamoto, Tokyo (JP)

(73) Assignee: PROTERIAL, LTD., Tokyo (JP)

( * ) Notice: Subject to any disclaimer, the term of this patent is extended or adjusted under 35 U.S.C. 154(b) by 297 days.

(21) Appl. No.: 17/706,318

(22) Filed: Mar. 28, 2022

(65) Prior Publication Data

US 2022/0319960 A1   Oct. 6, 2022

(30) Foreign Application Priority Data

Mar. 31, 2021 (JP) ................................. 2021-061298
Sep. 30, 2021 (JP) ................................. 2021-161081

(51) Int. Cl.
*H01L 23/49* (2006.01)
*G02B 23/24* (2006.01)
(Continued)

(52) U.S. Cl.
CPC .......... *H01L 23/49* (2013.01); *G02B 23/2484* (2013.01); *H01B 11/206* (2013.01);
(Continued)

(58) Field of Classification Search
CPC ............ G02B 23/2484; H01B 11/1891; H01B 11/1895; H01B 11/206; H01L 23/49;
(Continued)

(56) References Cited

U.S. PATENT DOCUMENTS 6,029,089 A * 2/2000 Hawkins ............... A61N 1/3752
439/271
10,999,538 B2   5/2021 Sato et al.
(Continued)

FOREIGN PATENT DOCUMENTS

JP   H10-125145 A   5/1998
JP   2009-117520 A   5/2009
(Continued)

OTHER PUBLICATIONS

Japanese Office Action, dated Sep. 7, 2021, in Japanese Application No. 2021-061298 and English Translation thereof.

*Primary Examiner* — William H. Mayo, III
*Assistant Examiner* — Rhadames Alonzo Miller
(74) *Attorney, Agent, or Firm* — MCGINN I.P. LAW GROUP, PLLC.

(57) ABSTRACT

A cable connection structure is provided with an electronic component including electrodes on an electrode-forming surface, a cable including electric wires connected to the electrodes respectively, and a buried member which is composed of a cured resin and embedded with the electric wires. At least three electric wires are separating wires including separating regions being separated from each other in the normal direction as being distant from the electrode-forming surface. At least three electrodes are arranged side by side on a virtual circle. At least three separating wires are connected to the at least three electrodes. The separating regions of the at least three separating wires are provided to be located eccentric radially outwardly in the virtual circle as being distant from the electrode surface in the normal direction of the electrode-forming surface. An angle between the separating region and the normal direction of the electrode-forming surface is 10 degrees or more and 45 degrees or less.

20 Claims, 15 Drawing Sheets

(51) Int. Cl.
*H01B 11/18* (2006.01)
*H01B 11/20* (2006.01)
*H01R 4/02* (2006.01)
*H01R 4/70* (2006.01)
*H01R 43/02* (2006.01)
*H04N 7/10* (2006.01)
*H04N 7/18* (2006.01)

(52) U.S. Cl.
CPC ......... *H01R 4/023* (2013.01); *H01R 43/0249* (2013.01); *H01R 43/0263* (2013.01); *H04N 7/10* (2013.01); *H04N 7/18* (2013.01); *H01B 11/1891* (2013.01); *H01B 11/1895* (2013.01); *H01R 4/70* (2013.01)

(58) Field of Classification Search
CPC ....... H01L 4/023; H01L 4/70; H01L 43/0249; H01L 43/0263; H04N 7/10; H04N 7/18
See application file for complete search history.

(56) References Cited

U.S. PATENT DOCUMENTS

| | | | |
|---|---|---|---|
| 2007/0100386 A1* | 5/2007 | Tronnes | A61N 1/3752 607/37 |
| 2007/0225772 A1* | 9/2007 | Lahti | A61N 1/3752 607/37 |
| 2010/0123291 A1* | 5/2010 | Dilmaghanian | F16J 15/025 264/318 |
| 2010/0267265 A1* | 10/2010 | Dilmaghanian | H01R 24/58 439/271 |
| 2011/0059639 A1* | 3/2011 | Dilmaghanian | H01R 24/58 439/271 |
| 2011/0160678 A1* | 6/2011 | Chong | A61M 5/1413 29/428 |
| 2012/0065625 A1* | 3/2012 | Nelson | A61M 39/12 604/533 |
| 2013/0053851 A1* | 2/2013 | Schmitz | A61B 17/3421 606/79 |
| 2014/0107709 A1* | 4/2014 | Schmitz | A61B 17/3421 606/279 |
| 2016/0045311 A1* | 2/2016 | McCann | A61F 2/2412 623/2.11 |
| 2019/0192861 A1* | 6/2019 | Lopez | A61N 1/36128 |
| 2019/0313037 A1* | 10/2019 | Sato | H04N 25/00 |
| 2019/0314635 A1* | 10/2019 | Iyer | H01R 13/622 |
| 2020/0058693 A1* | 2/2020 | Suyama | A61B 1/0011 |
| 2022/0022733 A1* | 1/2022 | Horibe | A61B 1/00149 |

FOREIGN PATENT DOCUMENTS

| | | |
|---|---|---|
| JP | 2015-058118 A | 3/2015 |
| JP | 2017-046854 A | 3/2017 |
| JP | 2019-180603 A | 10/2019 |
| WO | WO 2018/198188 A1 | 11/2018 |
| WO | WO 2020-217302 A1 | 10/2020 |

* cited by examiner

CABLE CONNECTION STRUCTURE

CROSS-REFERENCE TO RELATED APPLICATIONS

The present patent application claims the priority of Japanese patent application No. 2021-061298 filed on Mar. 31, 2021 and Japanese patent application No. 2021-161081 filed on Sep. 30, 2021, and the entire contents thereof are hereby incorporated by reference.

TECHNICAL FIELD

The present invention relates to a cable connection structure.

BACKGROUND ART

Patent Literature 1 discloses an endoscope including an imaging device having an image sensor, and a coaxial cable having four electric wires connected to four electrodes arranged in vertical and horizontal rows on an electrode-forming surface of the imaging device. In the endoscope described in Patent Literature 1, electrode-forming surface-side ends of the electric wires are embedded in a buried member made of an adhesive or the like.

CITATION LIST

Patent Literature

Patent Literature 1: JP2019-180603 A

SUMMARY OF THE INVENTION

In the endoscope described in Patent Literature 1, however, the resin in a molten state that constitutes the buried member does not easily penetrate gaps between the electric wires, and air bubbles may be formed in the buried member after curing. If air bubbles are formed in the buried member, for example, those air bubbles expand or contract with changes in temperature or atmospheric pressure, and the connection is easily subjected to outer pressure.

The present invention was made in light of the aforementioned circumstances, and it is an object to provide a cable connection structure that facilitates suppressing the formation of air bubbles in its buried member.

So as to achieve the above object, one aspect of the present invention provides: a cable connection structure, comprising:
  an electronic component including electrodes on an electrode-forming surface;
  a cable including electric wires connected to the electrodes respectively; and
  a buried member being formed by curing a molten resin filled around the electric wires, and being embedded with the electric wires,
  wherein at least three electric wires of the electric wires are separating wires including separating regions being separated from each other in the normal direction as being distant from the electrode-forming surface,
  wherein the electrodes include at least three electrodes arranged side by side on a virtual circle,
  wherein the electric wires include at least three separating wires connected to the at least three electrodes,
  wherein the separating regions of the at least three separating wires are provided to be located eccentric radially outwardly in the virtual circle as being distant from the electrode surface in the normal direction of the electrode-forming surface, and wherein an angle between the separating region and the normal direction of the electrode-forming surface is 10 degrees or more and 45 degrees or less.

So as to achieve the above object, another aspect of the present invention provides: a cable connection structure, comprising:
  an electronic component including electrodes on an electrode-forming surface;
  solders provided on each electrode surface of the electrodes;
  a cable including electric wires connected to the solders respectively; and
  a buried member being formed by curing a molten resin filled around the solders and the electric wires, and being embedded with the solders and the electric wires,
  wherein a boundary between the solder and the electric wire is an eccentric boundary that is eccentric with respect to the electrode surface when viewed from a normal direction of the electrode-forming surface,
  wherein the eccentric boundary is eccentric with respect to the electrode surface to be distant from at least one of other boundaries,
  wherein a direction in which a center of the eccentric boundary is aligned with a center of the electrode surface when viewed from the normal direction is an alignment direction, one side of the alignment direction in which is the eccentric boundary is eccentric with respect to the electrode surface is an eccentric side, and an opposite side to the eccentric side is an anti-eccentric side,
  wherein the solder constituting the eccentric boundary is configured in such a manner that a width in the alignment direction of a portion on the anti-eccentric side with respect to the eccentric boundary is greater than a width in the alignment direction of a portion on the eccentric side with respect to the eccentric boundary.

Effects of the Invention

According to the present invention, it is possible to provide a cable connection structure that facilitates suppressing the formation of air bubbles in its buried member.

BEST MODE FOR CARRYING OUT THE INVENTION

First Embodiment

The first embodiment of the present invention is described with reference to FIGS. 1 to 16. The embodiment described below is shown as a suitable specific example for implementing the present invention, and although there are parts that specifically illustrate various technically preferred technical matters, the technical scope of the present invention is not limited to this specific aspect.

Figure 1:
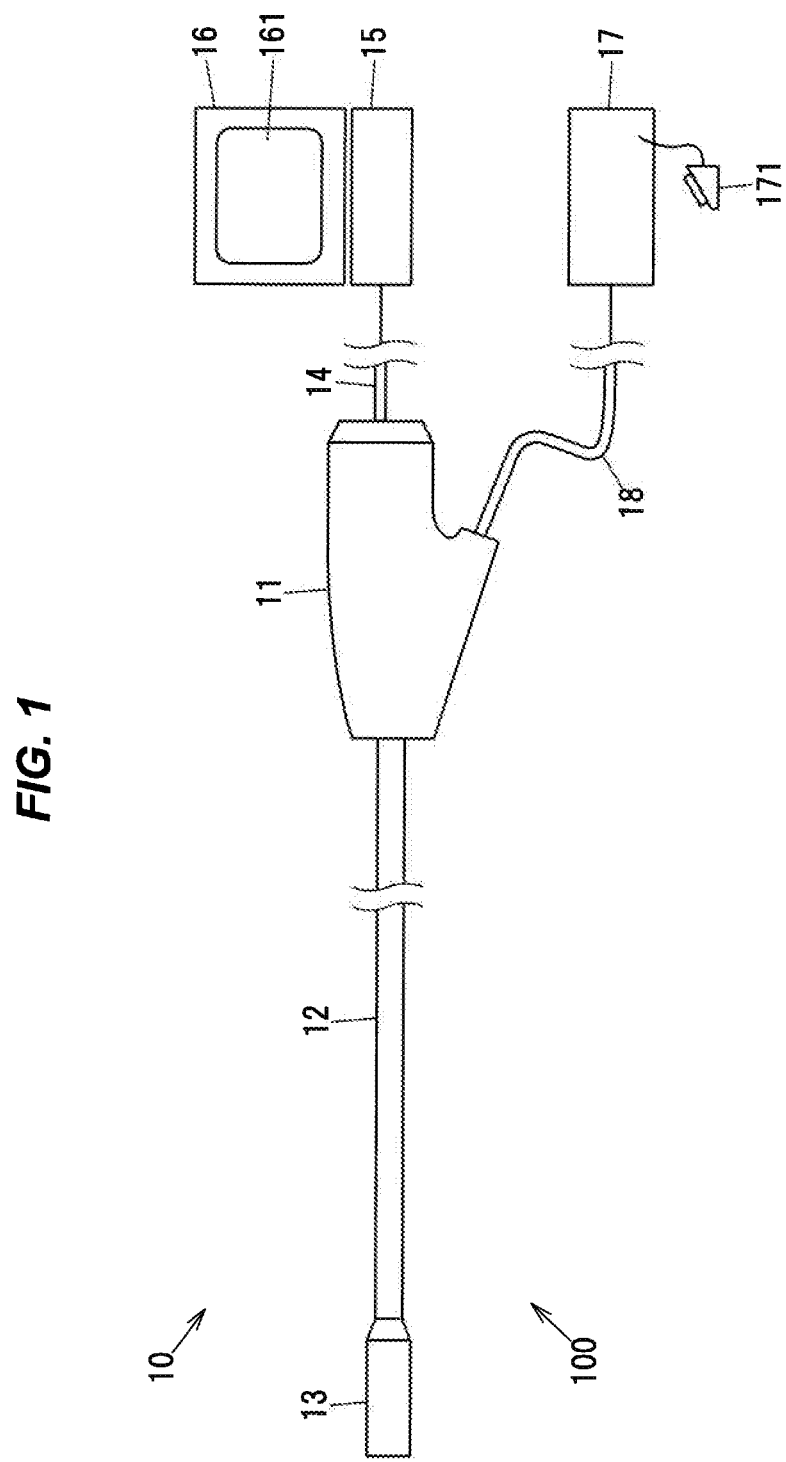
FIG. 1 is a schematic configuration diagram showing an endoscope system with a cable connection structure in the first embodiment.

FIG. 1 is a schematic configuration diagram showing an endoscope system 10 with a cable connection structure 1 in the first embodiment. The endoscope system 10 includes an endoscope 100, an image processor 15 for processing image data obtained by the endoscope 100, a display 16 for displaying an image processed by the image processor 15 on a screen 161, and a liquid feeder 17 for dispensing a liquid for cleaning a camera lens or other liquid in response to the operation of a foot switch 171.

The endoscope 100 is composed of an operating unit 11, an insertion tube 12, and a camera head 13. The operating unit 11 is a part to be operated by a physician. The operating unit 11 is being connected to the image processor 15 by use of a communication cable 14 while at the same time being connected to the liquid feeder 17 by use of a hose 18. The insertion tube 12 connects the operating unit 11 and the camera head 13 together. The length of the insertion tube 12 is, e.g., 1 m or more and 4 m or less. The camera head 13 along with a portion of the insertion tube 12 is inserted into the subject's body. In the following description, the side in which the camera head 13 is located relative to the insertion tube 12 is also referred to as a distal end side, while the opposite side thereto is also referred to as a proximal end side.

Figure 2:
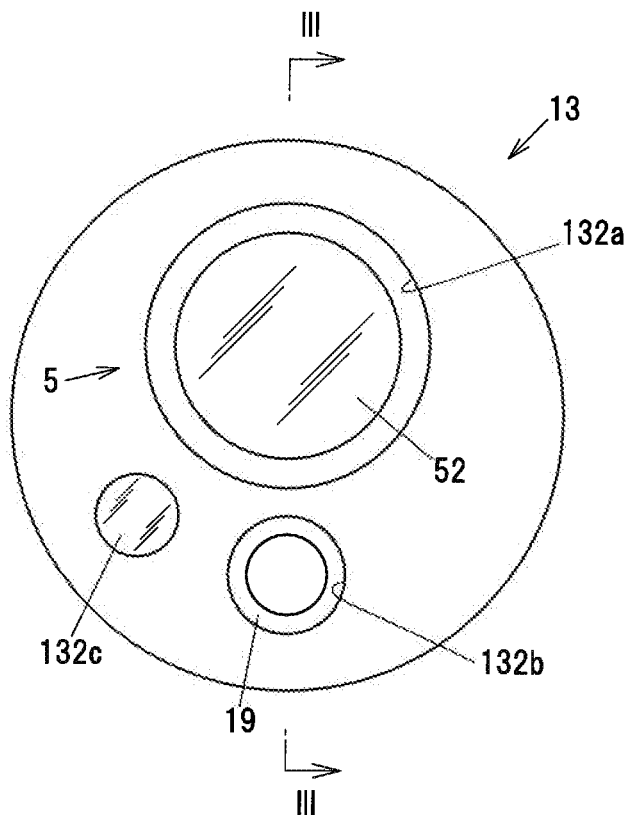
FIG. 2 is an end face view showing a tip end face of a camera head in the first embodiment.
Figure 3:
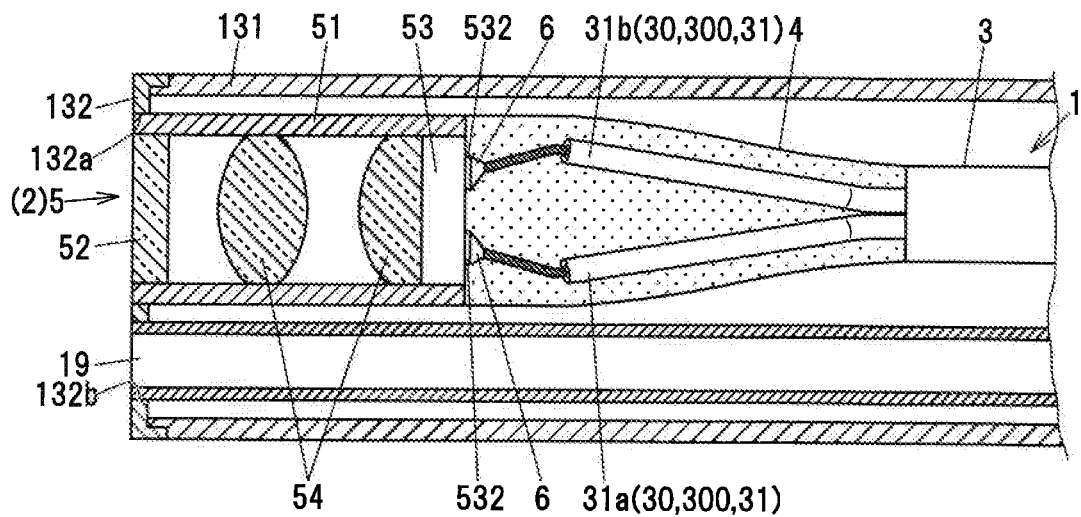
FIG. 3 is a cross-sectional view taken along a line in a direction of arrows of FIG. 2.

FIG. 2 an end face view showing a tip end face (i.e., distal end face) of the camera head 13 in the first embodiment. FIG. 3 is a cross-sectional view taken along a line in a direction of arrows of FIG. 2. The camera head 13 is composed of an outer cylindrical body 131 made of resin, and a cover body 132 for closing a tip end face (i.e., distal end face) of the outer cylindrical body 131. Inside the outer cylindrical body 131 and the insertion tube 12, a tube 19 for distributing the liquid, etc. fed from the liquid feeder 17, an optical fiber (not shown), and a cable 3, which will be described later, are inserted and passed therethrough. In addition, an imaging device 5, described below, is located inside the outer cylindrical body 131.

The cover body 132 is formed with a through hole 132a for mating a tip end of the imaging device 5 and a through hole 132b for mating a tip end of the tube 19. The cover body 132 is also provided with an irradiation window 132c for emitting irradiation light to irradiate the region to be subjected to imaging. Light guided by an optical fiber, not shown, is irradiated through the irradiation window 132c.

As shown in FIG. 3, the imaging device 5 is composed of a circular cylindrical body 51, a translucent imaging window 52 fixed to one end of the circular cylindrical body 51, an image sensor 53 fixed to the other end of the circular cylindrical body 51, and lenses 54 arranged between the imaging window 52 and the image sensor 53. The image sensor 53 can be, e.g., a CMOS image sensor or a CCD (Charge-Coupled Device) image sensor. The imaging device 5 converts the data of the optical image formed in the image sensor 53 into an electrical signal and outputs it to the image processor 15 through the cable 3.

Figure 4:
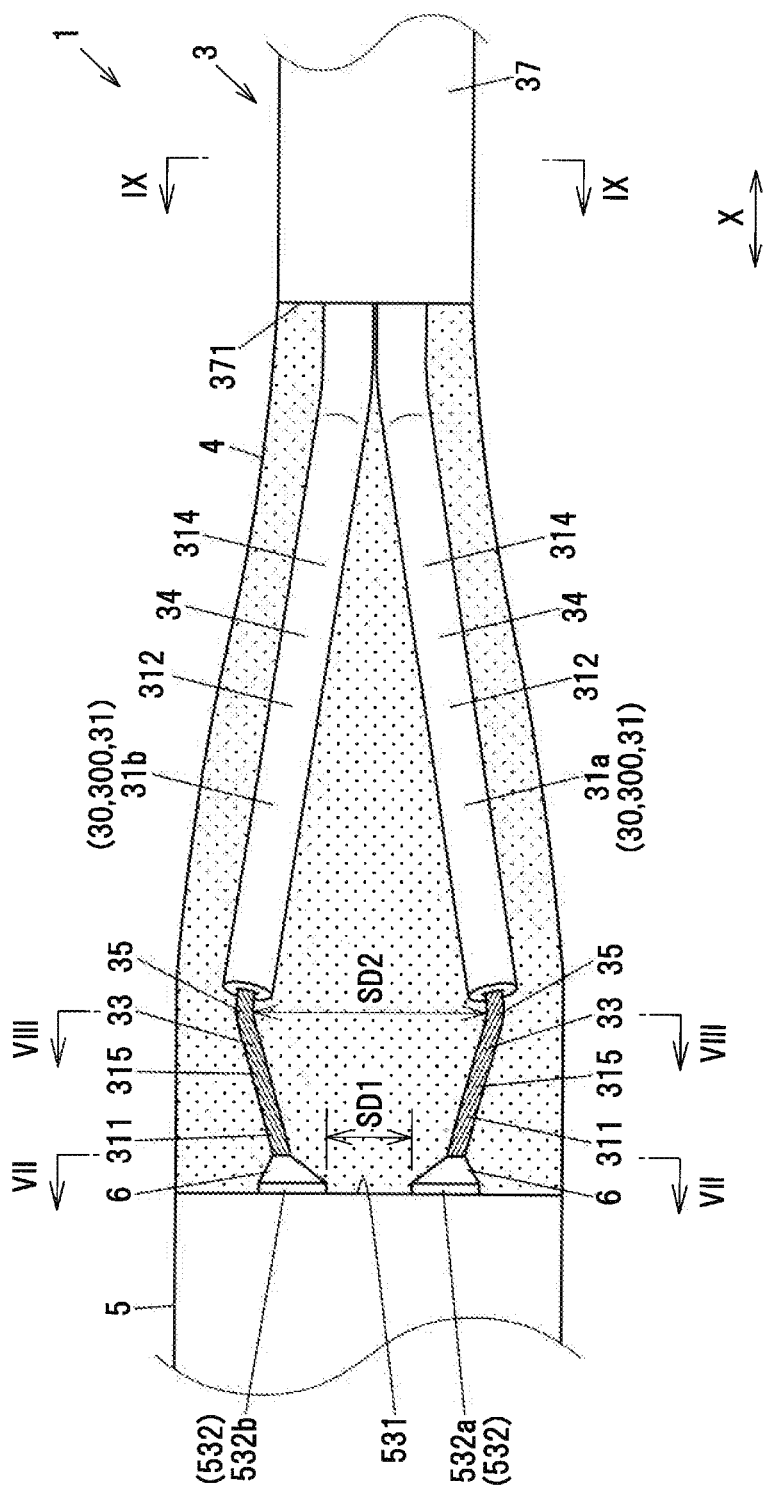
FIG. 4 is an enlarged plan view showing a peripheral part of a connection between a cable and an imaging device in the cable connection structure in the first embodiment.
Figure 5:
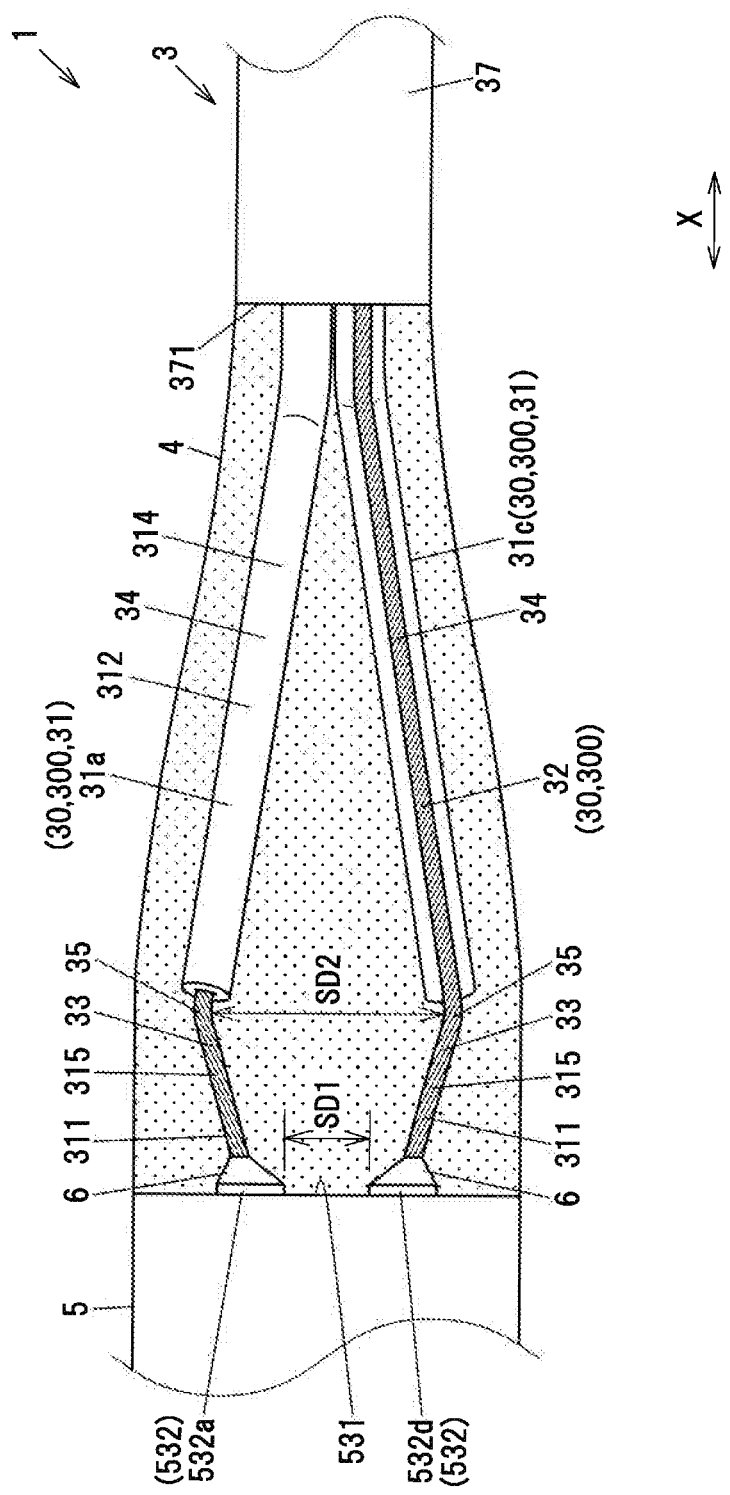
FIG. 5 is an enlarged side view showing the peripheral part of the connection between the cable and the imaging device in the cable connection structure in the first embodiment.
Figure 6:
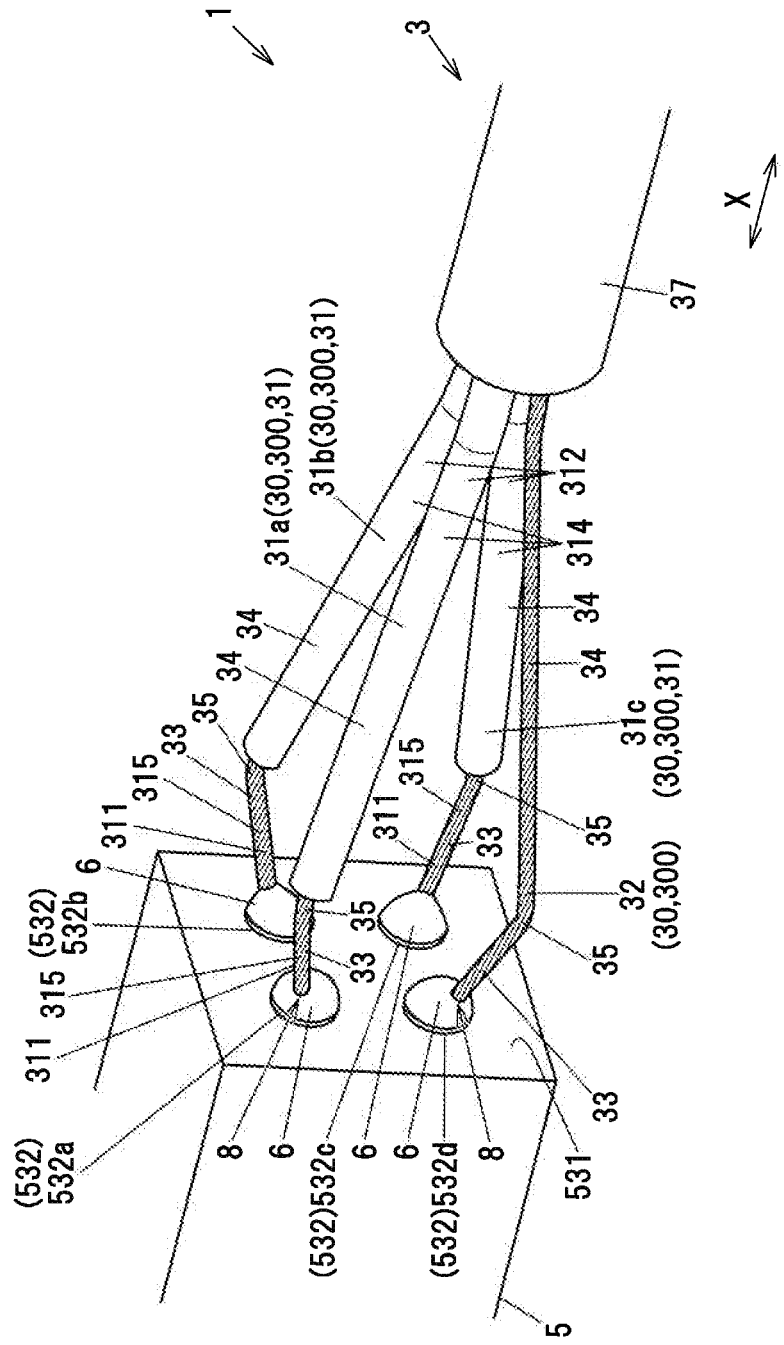
FIG. 6 is an enlarged perspective view showing the peripheral part of the connection between the cable and the imaging device in the cable connection structure in the first embodiment, in which the buried member is not shown.
Figure 7:
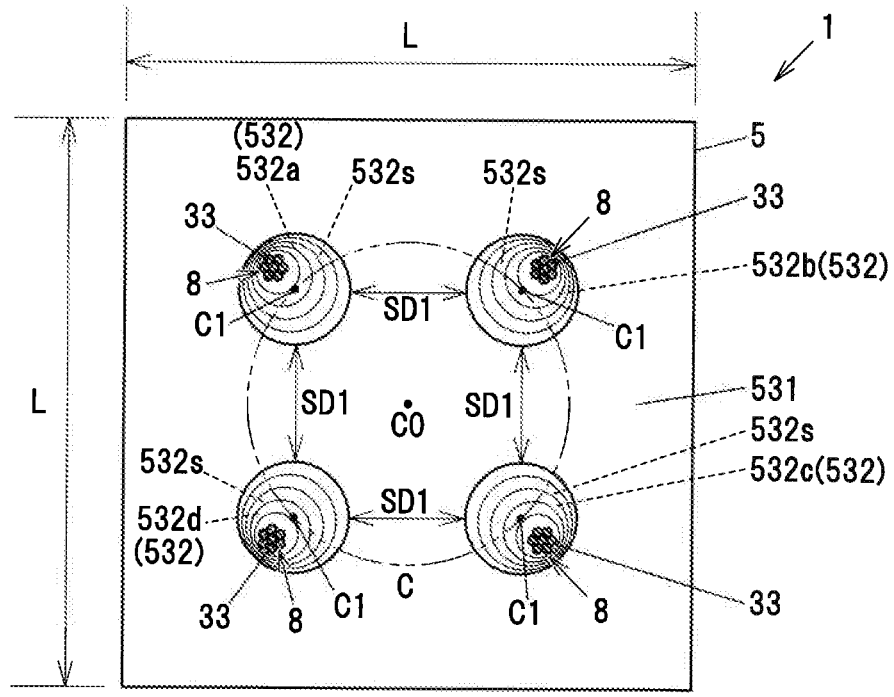
FIG. 7 is a cross-sectional view taken along a line VII-VII in a direction of arrows of FIG. 4, passing through a boundary between a solder and the electric wire.
Figure 8:
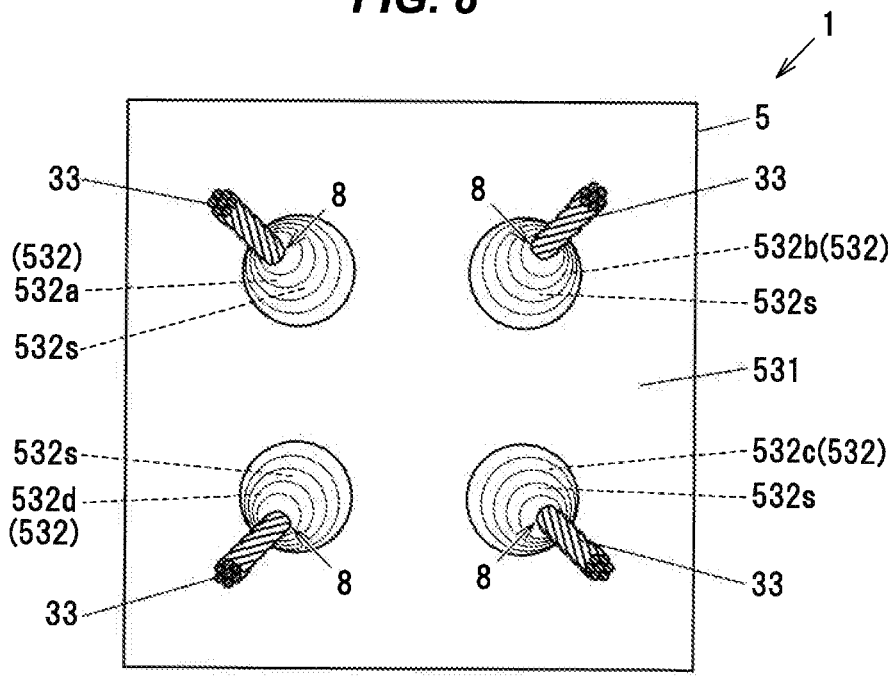
FIG. 8 is a cross-sectional view taken along a line VIII-VIII in a direction of arrows of FIG. 4.
Figure 9:
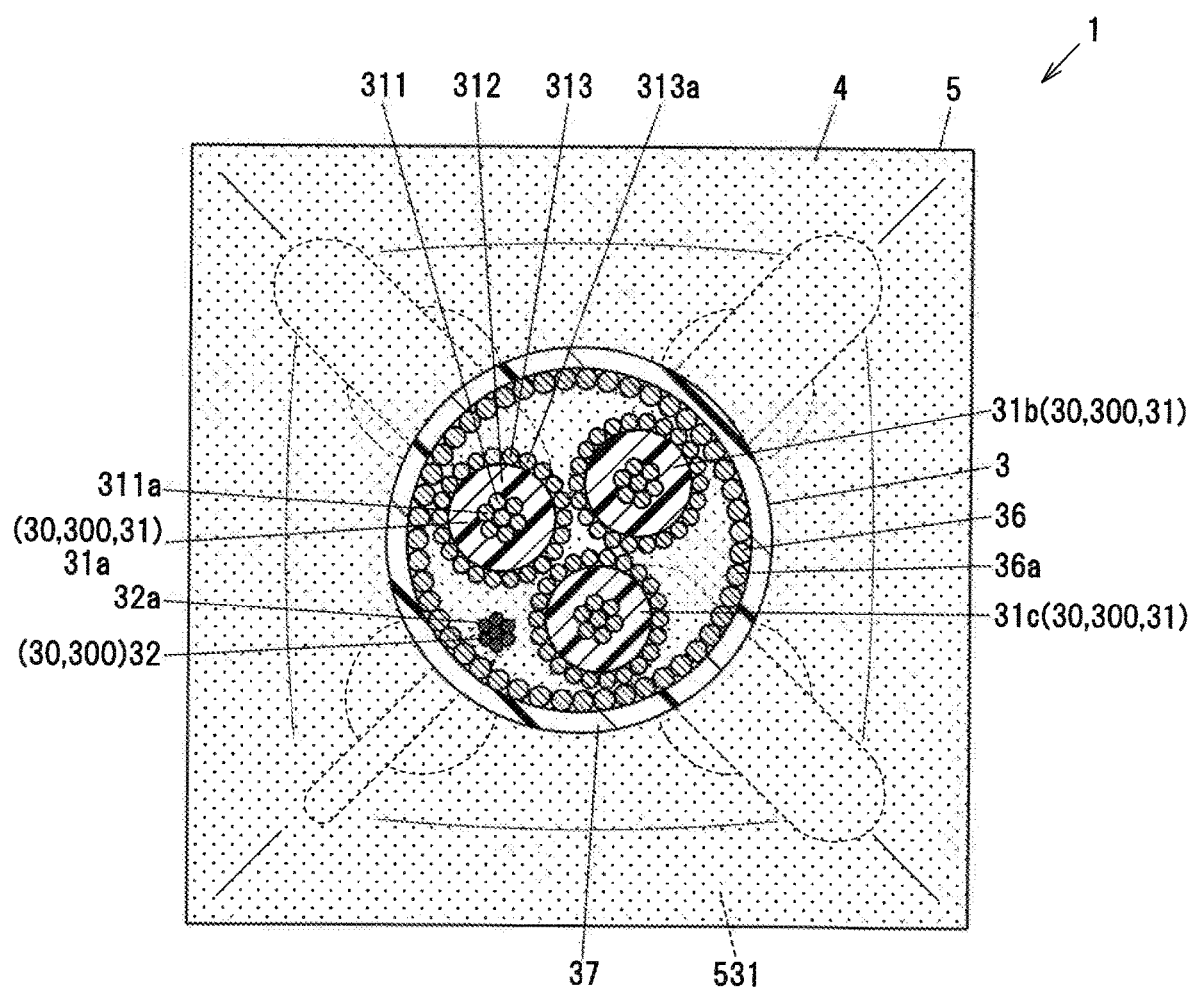
FIG. 9 is a cross-sectional view taken along a line IX-IX in a direction of arrows of FIG. 4.

FIG. 4 is an enlarged plan view showing a peripheral part of a connection between a cable 3 and the imaging device 5 in the cable connection structure 1 in the first embodiment. FIG. 5 is an enlarged side view showing the peripheral part of the connection between the cable 3 and the imaging device 5 in the cable connection structure 1 in the first embodiment. FIG. 6 is an enlarged perspective view showing the peripheral part of the connection between the cable 3 and the imaging device 5 in the cable connection structure 1 in the first embodiment, in which the buried member ("4" in FIGS. 4, 5, etc.) is not shown. FIG. 7 is a cross-sectional view taken along a line VII-VII in a direction of arrows of FIG. 4, passing through a boundary 8 between a solder 6 and an electric wire 30. FIG. 8 is a cross-sectional view taken along a line VIII-VIII in a direction of arrows of FIG. 4. FIG. 9 is a cross-sectional view taken along a line IX-IX in a direction of arrows of FIG. 4.

As shown in FIGS. 6 to 8, an electrode-forming surface 531, which is a proximal end side surface of the imaging device 5, is formed with four electrodes 532. As shown in FIG. 7, the electrode-forming surface 531 is formed in a rectangular shape, each side of which can be configured to have a length L of not shorter than 0.6 mm and not longer than 1.1 mm, for example. The four electrodes 532 are formed as the electrodes for the image sensor 53.

As shown in FIG. 7, the four electrodes 532 are aligned on a virtual circle C with one point on the electrode-forming surface 531 positioned at its center C0, while at the same time being arranged in four positions that are configured as the vertices of a square. In the present embodiment, the four electrodes 532 are constituted by a power supply electrode 532a for feeding power to the imaging device 5, and a data output electrode 532b for outputting the image signal converted from the data of the optical image formed in the image sensor 53, a command receiving electrode 532c for receiving a command signal to allow a predetermined operation (e.g., imaging operation) in the imaging device 5, and a ground electrode 532d for being connected to ground potential. As shown in FIGS. 4, 5, and 7, a shortest distance SD1 between adjacent ones of the four electrodes 532 in a circumferential direction along the virtual circle C can be, for example, 0.1 mm or more and 0.3 mm or less. The cable 3 is disposed in such a manner as to be electrically connected to each of the four electrodes 532.

As shown in FIG. 9, the cable 3 is composed of four electric wires 30 configured to be connected to the four electrodes 532, a shield conductor 36 covering the four electric wires 30 collectively, and a jacket (i.e., outer sheath) 37 covering the shield conductor 36. The four electric wires 30 are composed of three coaxial wires 31 and one drain wire 32.

The three coaxial wires 31 are composed of a power supply coaxial wire 31a configured to be connected to a power supply electrode 532a, a data transmission coaxial wire 31b configured to be connected to a data output electrode 532b, and a command transmission coaxial wire 31c configured to be connected to a command receiving electrode 532c. The power supply coaxial wire 31a feeds the power for the imaging device 5. The data transmission coaxial wire 31b transmits an imaging signal output from the data output electrode 532b. The command transmission coaxial wire 31c transmits a command signal output from the command receiving electrode 532c. Thereafter, if no special distinction is made between the power supply coaxial wire 31a, the data transmission coaxial wire 31b, and the command transmission coaxial wire 31c, they are simply referred to as a coaxial wire 31.

The coaxial wire 31 is composed of an inner conductor 311 as a core wire, an inner insulator 312 covering an outer circumference of the inner conductor 311, and an outer conductor 313 covering an outer circumference of the inner insulator 312. The inner conductor 311 is a twisted wire formed by twisting (i.e., stranding) multiple strands (elementary wires) 311a. A diameter of the inner conductor 311 is 0.1 mm or less. More specifically, the diameter of the inner conductor 311 can be set to e.g., 40 to 46 AWG (the diameter is 0.48 mm or more and 0.093 mm or less). "AWG" is an abbreviation of American Wire Gauge. In the case where the inner conductor 311 is composed of the twisted wire as in the present embodiment, the diameter of the inner conductor 311 is the diameter of a circumscribed circle of the multiple strands constituting the inner conductor 311.

The inner insulator 312 surrounding the inner conductor 311 is composed of a resin which is electrically insulating. The diameter of the inner insulator 312 is 0.1 mm or more and 0.25 mm or less.

The outer conductor 313 is composed of multiple strands 313a being helically and laterally wrapped to be in contact with an outer periphery surface of the inner insulator 312. The outer conductor 313 may be composed of multiple braided wires, or composed of a metal foil covering the outer periphery surface of the inner insulator 312. In addition, the outer conductor 313 may be composed of a conductive tape formed on one or both sides of a band made of a resin, either longitudinally or laterally wrapped around the inner insulator 312.

A drain wire 32 is configured to be connected to the ground electrode 532d. The drain wire 32 is composed of multiple strands 32a being twisted together. The drain wire 32 does not include an electrically insulating coating and is electrically connected to the outer conductor 313 of each coaxial wire 31 and the shield conductor 36 to provide the ground potential.

The shield conductor 36 is composed of multiple strands 36a of the coaxial wire 31, which are helically and laterally wrapped. The shield conductor 36 may be composed of multiple braided wires, or composed of a metal foil placed on an inner periphery surface of the jacket 37. The shield conductor 36 may also be composed of a conductive tape formed on one or both sides of a band made of a resin, either longitudinally or laterally wrapped around the four electric wires 30.

The jacket 37 collectively covers a portion around the four electric wires 30 and the shield conductor 36 excluding ends closer to an electrode-forming surface 531 (i.e., the distal ends) of the four electric wires 30 and the shield conductor 36. The jacket 37 is formed by forming an electrically insulating resin in a tubular form. The shield conductor 36 and the outer conductors 313 of the three coaxial wires 31 are cut at a tip end of the jacket 37. As shown in FIGS. 4 to 6, the inner conductor 311 and the inner insulator 312 in the three coaxial wires 31 and the drain wire 32 are exposed at the tip end of the jacket 37.

The portion exposed at the tip end of the jacket 37 in the coaxial wire 31 includes an insulator-exposed portion 314 in which the inner insulator 312 is exposed toward the distal end side from the outer conductor 313 and the jacket 37, and a conductor-exposed portion in which an end to be connected to the corresponding electrode 532 of the inner conductor 311 is exposed toward the distal end side from the inner insulator 312. The insulator-exposed portion 314 is longer than the conductor-exposed portion 315. In the respective three coaxial wires 31, the tip ends of the insulator-exposed portions 314 are equally located with respect to each other in the direction normal to the electrode-forming surface 531 of the imaging device 5. Hereinafter, the direction normal to the electrode-forming surface 531 of the imaging device 5 is referred to as an X-direction. Each of the tip ends of the conductor-exposed portions 315 of the three coaxial wires 31 and the tip end of the one drain wire 32 of the four electric wires 30 are mechanically and electrically connected to the four electrodes 532 by use of a solder 6, which is provided on electrode surfaces 532s, which are configured as proximal end side surfaces of the four electrodes 532. In the four electric wires 30, the entire portions exposed from the jacket 37 toward the distal end side is buried inside the buried member 4, which will be described later.

As shown in FIGS. 4 to 6, the four electric wires 30 are separating wires 300 including portions which are separated from each other in the X-direction as being distant from the electrode-forming surface 531, within the buried member 4. In the present embodiment, the four electric wires 30 include separating regions 33 configured to be separated from each other as being distant from the electrode-forming surface 531 toward the jacket 37, and approaching regions 34 configured to be approaching (i.e., closer to) each other as being distant from the separating regions 33 toward the jacket 37, within the buried member 4.

As shown in FIGS. 7 and 8, the four separating regions 33 are inclined radially outwardly in the X-direction as being distant from the electrode-forming surface 531. The radially outward side is outside the virtual circle C in the radial direction, and, in the present invention, it is also outside the cable 3 in the radial direction. As shown in FIGS. 4 and 5, the separating region 33 of each of the four electric wires 30 is formed in a straight line.

In each of the three coaxial wires 31 of the four electric wires 30, the approaching region 34 is composed of a coated wire portion (i.e., the insulator-exposed portion 314) including the inner conductor 311 as the core wire covered by the insulator (i.e., the inner insulator 312), and the separating region 33 is composed of a bare wire portion (i.e., the conductor-exposed portion 315) of the inner conductor 311 exposed from the insulator (i.e., the inner insulator 312).

The three coaxial wires 31 are bent to be convex radially outwardly at a base of the conductor-exposed portion 315 (i.e., the end on the side of the insulator-exposed portion 314 in the conductor-exposed portion 315). The separating region 33 and the approaching region 34 are separated by a bending portion 35 as a boundary. In other words, in the three coaxial wires 31, the separating region 33 is consisted of the conductor-exposed portion 315. The approaching region 34 is mainly composed of the insulator-exposed portion 314, although the tip end is composed of the conductor-exposed portion 315. In addition, the drain wire 32 also has a bending portion 35 which is bent to be convex radially outwardly. The bending portion 35 of the electric wire 30 is bent to be convex in a direction away from the electric wire 30 adjacent in a circumferential direction along the virtual circle C.

Figure 10:
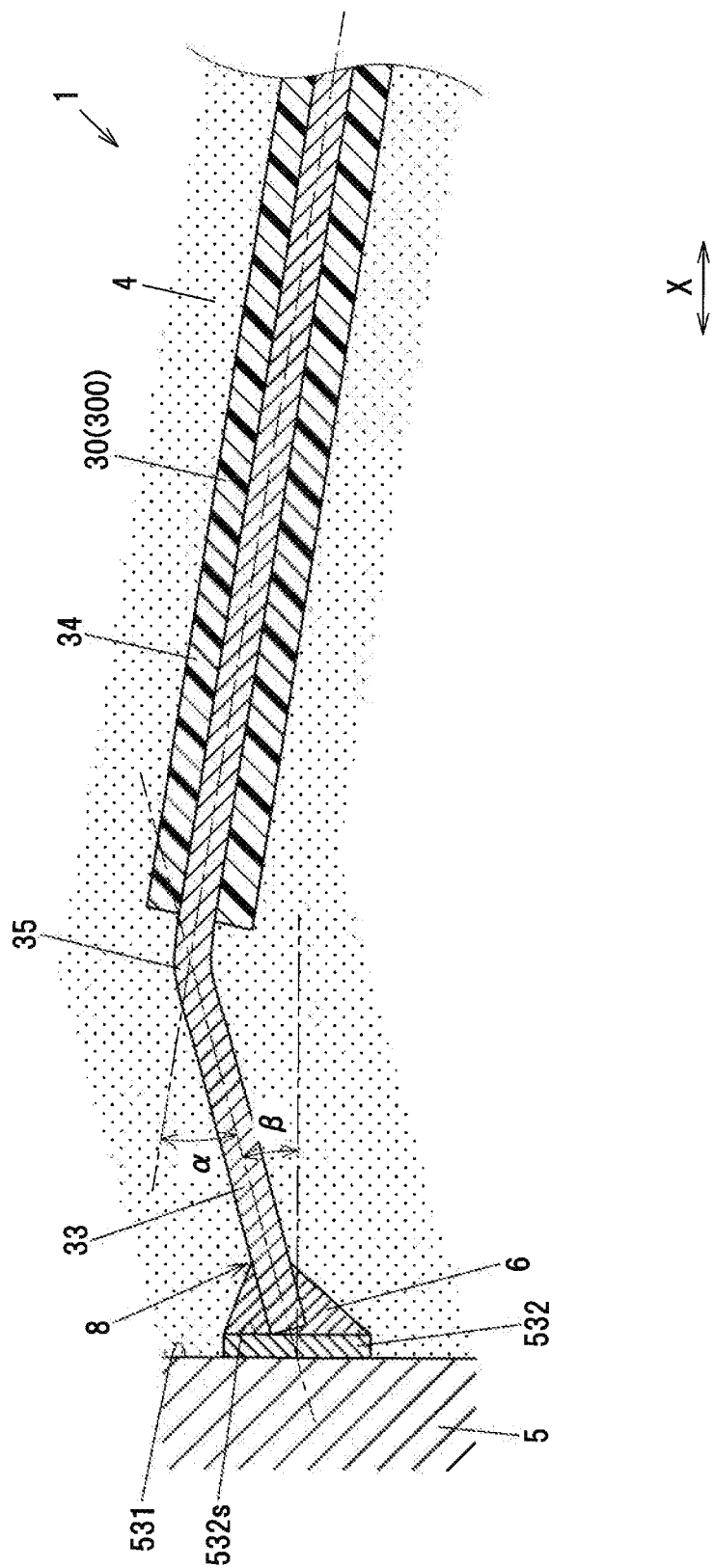
FIG. 10 is a cross-sectional view showing the cable connection structure in the first embodiment, including a separating region and an approaching region of the electric wire.

FIG. 10 shows a cross-sectional view of the cable connection structure 1, including the separating region 33 and the approaching region 34 of the electric wire 30. As shown in FIG. 10, an angle α made between the longitudinal direction of the separating region 33 and the longitudinal direction of the approaching region 34 can be, e.g., 3 degrees or more and 15 degrees or less in the electric wire 30. An angle β made between the separating region 33 and the X-direction can be e.g., 10 degrees or more and 45 degrees or less.

As shown in FIGS. 4 to 6, the respective bending portions 35 of the four electric wires 30 are equidistant to each other in the X-direction. As shown in FIGS. 4 and 5, a shortest distance SD2 between the bending portions 35 of the electric wire 30, which are adjacent in the circumferential direction along the virtual circle C, is greater than a shortest distance SD1, and can be 0.25 mm or more and 0.75 mm or less. In the present embodiment, the entire bending portion 35 is positioned radially outwardly with respect to the corresponding electrode 532 to be connected with the bending portion 35.

As shown in FIG. 7, the boundary 8 between the solder 6 and the electric wire 30 is eccentric radially outwardly with respect to the electrode surface 532s when viewed from the X-direction. In other words, when viewed from the X-direction, the center (see C1 in FIGS. 11 and 12) of the boundary 8 is located radially outwardly with respect to a center C2 of the electrode surface 532s. Thus, when viewed from the X-direction, each boundary 8 is eccentric far from all other boundaries 8 with respect to the electrode surface 532s. Thus, when viewed from the X-direction, the boundary 8, which is eccentric far from at least one other boundary 8 with respect to the electrode surface 532s, is referred to as an eccentric boundary. In the present embodiment, all boundaries 8 are the eccentric boundaries, and the boundary 8 is also referred to as eccentric boundary 8. In the case of explanation of a specific eccentric boundary 8, the electric wire 30, the solder 6, the electrode 532, the electrode surface 532s and the like shall mean the electric wire 30, the solder 6, the electrode 532, and the electrode surface 532s and the like, which are electrically connected to this specific eccentric boundary 8, unless otherwise noted.

The boundary 8 is the boundary between the solder 6 and the electric wire 30 when they are visually observed. In other words, the boundary 8 is the portion where a surface of the solder 6 contacts with the electric wire 30, and formed in a closed curve. The center C1 of the boundary 8 shall mean the center of gravity (i.e., the geometric center) of a two-dimensional shape surrounded by the closed curve as described above. In the present embodiment, the electrode surface 532s is formed in a circular shape, and the center C2 of the electrode surface 532s is the center of this circle. However, if the electrode surface 532s is formed in a non-circular shape or the like, the center C2 of the electrode surface 532s shall mean the center of gravity of the electrode surface 532s. FIGS. 7 and 8 show examples where the solder 6 is located all over the electrode surface 532s, and the outer periphery position of the solder 6 when viewed from the proximal end side is aligned with the outer periphery position of the electrode surface 532s.

Figure 11:
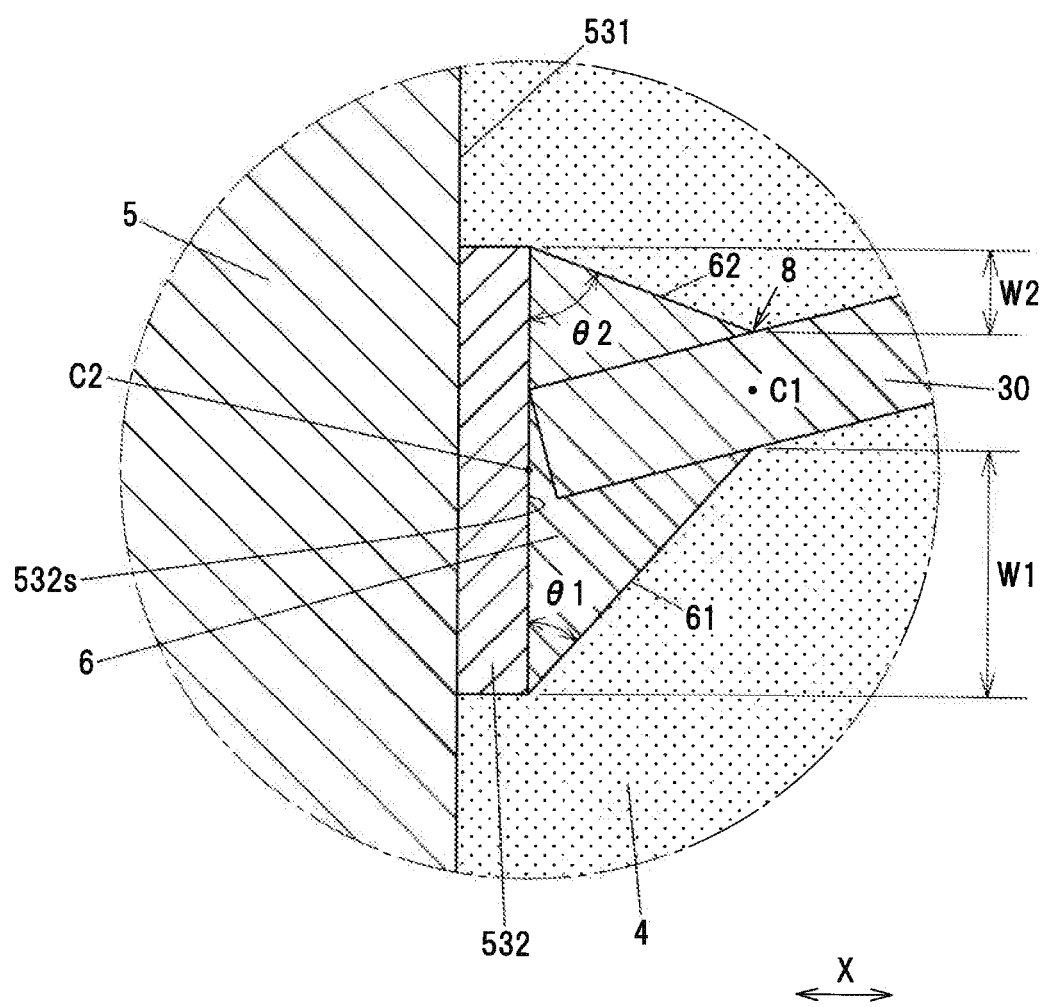
FIG. 11 is an enlarged view of a region in vicinity of the solder of FIG. 10.
Figure 12:
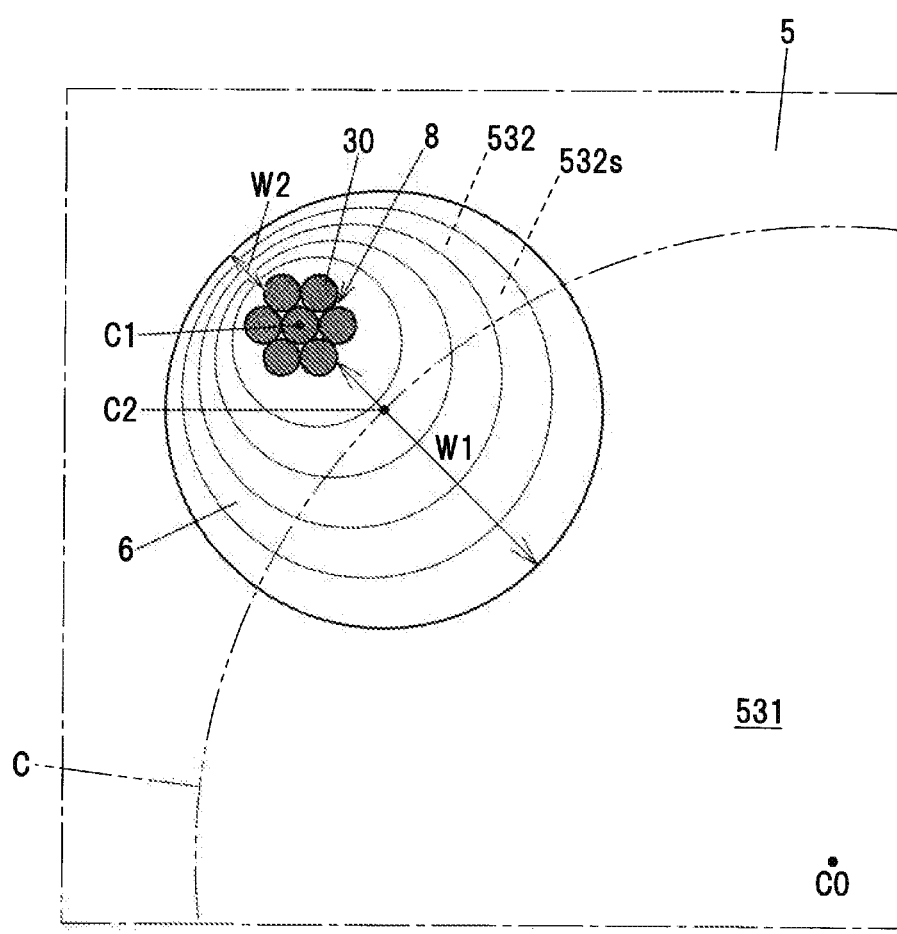
FIG. 12 is an enlarged view of a region in vicinity of the solder located at the upper left of FIG. 7.

FIG. 11 is an enlarged view of a part in vicinity of the solder 6 of FIG. 10. FIG. 12 is an enlarged view of a part in vicinity of the solder located at the upper left of FIG. 7. The solder 6 constituting the eccentric boundary 8 in configured in such a manner that a radial width W1 of a radially inward portion with respect to the eccentric boundary 8 is greater than a radial width W2 of a radially outward portion with respect to the eccentric boundary 8. The width W1 can be more than twice the width W2, and it can be equal to or more than 10 times the width W2.

In a cross-section passing through the center C1 of the eccentric boundary 8 and the center C2 of the electrode surface 532s and being parallel to the X-direction (e.g., FIGS. 10 and 11), an angle θ1 made between the radial direction and a first surface 61 of the solder 6, which is located radially inwardly with respect to the eccentric boundary 8 is smaller than an angle θ2 made between the radial direction and a second surface 62 of the solder 6, which is located radially outwardly with respect to the eccentric boundary 8. If the cross-sectional shape of the first surface 61 is a curved line rather than a straight line, the angle θ1 shall be the angle made between the radial direction and the distalmost portion of the first surface 61. Similarly, if the cross-sectional shape of the second surface 62 is a curved line rather than a straight line, the angle θ2 shall be the angle made between the radial direction and the distalmost portion of the second surface 62.

The buried member 4 is configured in such a manner that entire part exposed from the jacket 37 in the four electric wires 30, including the connections between the electric wires 30 and the electrodes 532, is buried within the buried member 4. In the X-direction, the buried member 4 is provided from the electrode-forming surface 531 to a tip end face (i.e., distal end face) 371 of the jacket 37. The buried member 4 is also filled inwardly with respect to the four electric wires 30. The portion located inwardly with respect to the four electric wires 30 in the buried member 4 is provided up to a part in vicinity of the tip end face 371 of the jacket 37.

The distal portion of the buried member 4 is provided substantially all over the electrode-forming surface 531, so that it does not appear from the electrode-forming surface 531. The proximal portion of the buried member 4 is located at the tip end face 371 of the jacket 37. The buried member 4 is shaped in such a manner that the outer shape is reduced in diameter (i.e., tapered) toward the jacket 37. As shown in FIG. 9, when viewed from the X-direction, the buried member 4 is located at the same position as the outer periphery of the electrode-forming surface 531, or inside the outer periphery of the electrode-forming surface 531. In the present embodiment, the distal end portion of the buried member 4 is formed substantially all over the electrode-forming surface 531. When viewed from the X-direction, the outer periphery of the buried member 4 is formed in substantially the same position as the outer periphery of the electrode-forming surface 531.

The buried member 4 is composed of an electrically insulating material, e.g., adhesives such as acrylate, resins such as epoxy resin. In the present embodiment, the buried member 4 has a viscosity of 900 mPa·s or more and 2000 mPa·s or less in the molten state before curing.

Next, with referring to FIGS. 13 to 16, an example of manufacturing methods of the cable connection structure 1 in the present embodiment will be explained. The manufacturing method of the cable connection structure 1 in the present embodiment is to carry out the bending step, the alignment step, the joining step, and the burying step in this order. The present invention is not limited thereto. For example, the alignment step may be carried out prior to the bending step.

Figure 13:
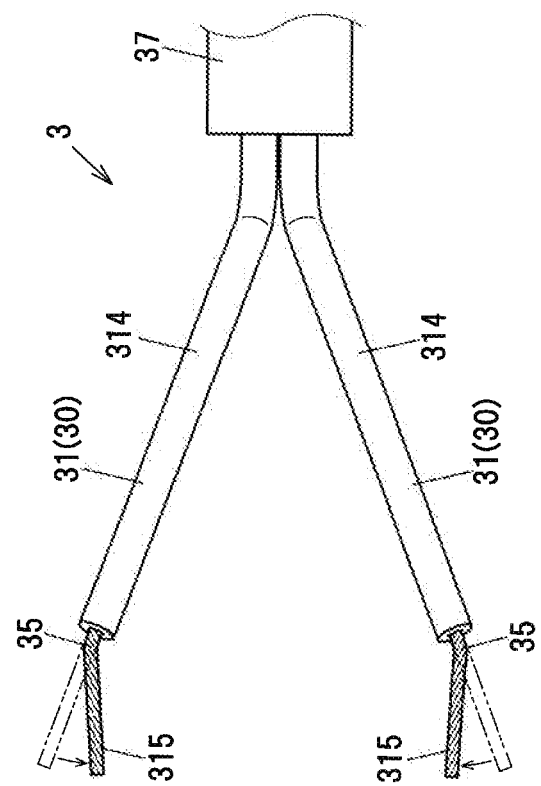
FIG. 13 is a side view of the cable showing a bending step of the cable connection structure in the first embodiment.

FIG. 13 is a side view of the cable 3 showing the bending step of the cable connection structure 1. In the bending step, base portions of respective conductor-exposed portions 315 of the four electric wires 30 that are substantially straight and protruding from the jacket 37 are bent, so that bending portions 35 are formed at the respective four electric wires 30. It is also possible to have soldering on the respective conductor-exposed portions 315 and the drain wire 32 before the bending step. According to this pre-soldering, it is possible to suppress the twists of the conductor-exposed portions 315 and the drain wire 32, which are made of twisted wires, from loosening during the bending step, and to facilitate bending of the conductor-exposed portions 315 and the drain wire 32.

Figure 14:
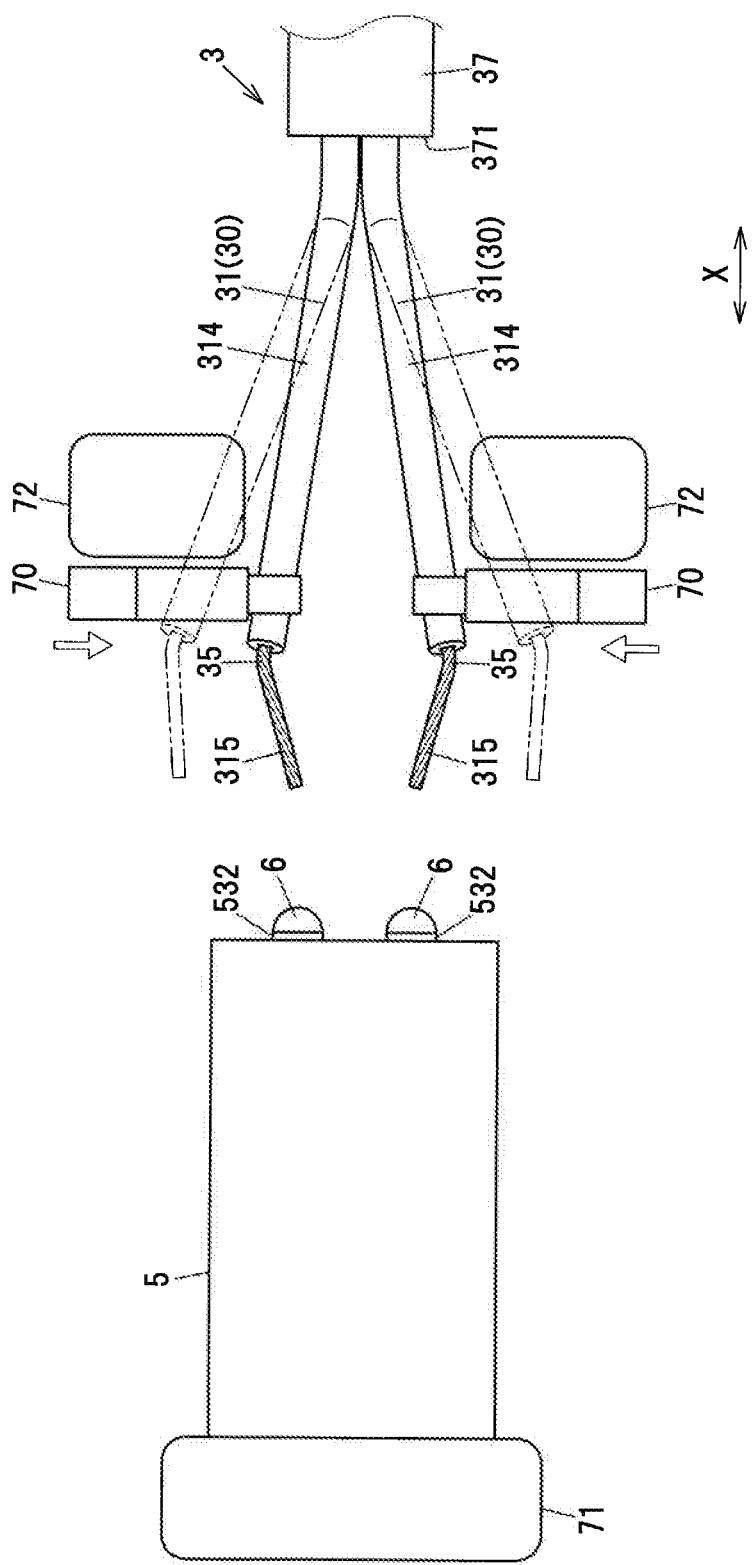
FIG. 14 is a plan view showing an alignment step of the cable connection structure in the first embodiment.
Figure 15:
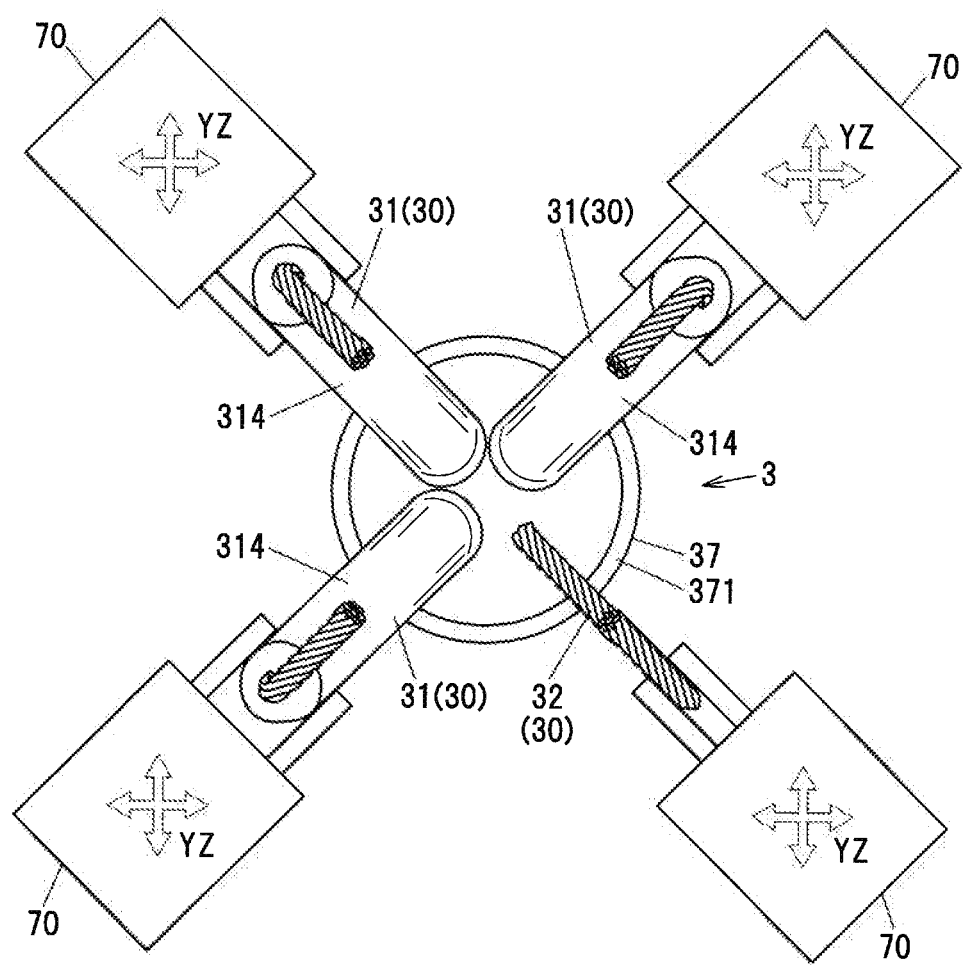
FIG. 15 is a front view showing the alignment step of the cable connection structure in the first embodiment.

FIG. 14 is a plan view showing the alignment step of the cable connection structure 1. FIG. 15 is a front view showing the alignment step of the cable connection structure 1. As shown in FIG. 14, in the alignment step, the imaging device 5 with the solder 6 on each of the four electrodes 532 is firstly aligned with the cable 3 in the two-dimensional direction perpendicular to the X-direction. In this case, the electrode-forming surface 531 is opposing in the X-direction with the tip end face 371 of the jacket 37 of the cable 3.

Then, as shown in FIGS. 14 and 15, each of the four electric wires 30 protruding in a random direction from the jacket 37 is held by chucks 70. The chuck 70 for holding the coaxial wire 31 holds the tip end of the insulator-exposed portion 314. The chuck 70 for holding the drain wire 32 holds the drain wire 32 at the same position in the X-direction as the chucks 70 for holding the coaxial wires 31. The chuck 70 for holding the coaxial wire 31 may hold the conductor-exposed portion 315 of the coaxial wire 31. Then, each chuck 70 is moved in the two-dimensional direction YZ perpendicular to the X-direction in such a manner that the tip ends of the respective four electric wires 30 are positioned in the X-direction overlapping the corresponding electrodes 532 to be connected to the four electric wires 30.

In FIG. 14, a first heater 71 for heating the solder 6 from the distal end side of the imaging device 5 and second heaters 72 for heating the solder 6 from the proximal end side of the chucks 70 are shown together. As an example, each of the first heater 71 and the second heaters 72 may be equipped with a coil-shaped electric heating element that generates heat as it is energized in a casing having an electrical isolation. Four second heaters 72 are provided in correspondence with the four chucks 70, and each second heater 72 is fixed to each chuck 70. During the alignment step, the first heater 71 and the second heaters 72 will be set in a non-heated state.

Figure 16:
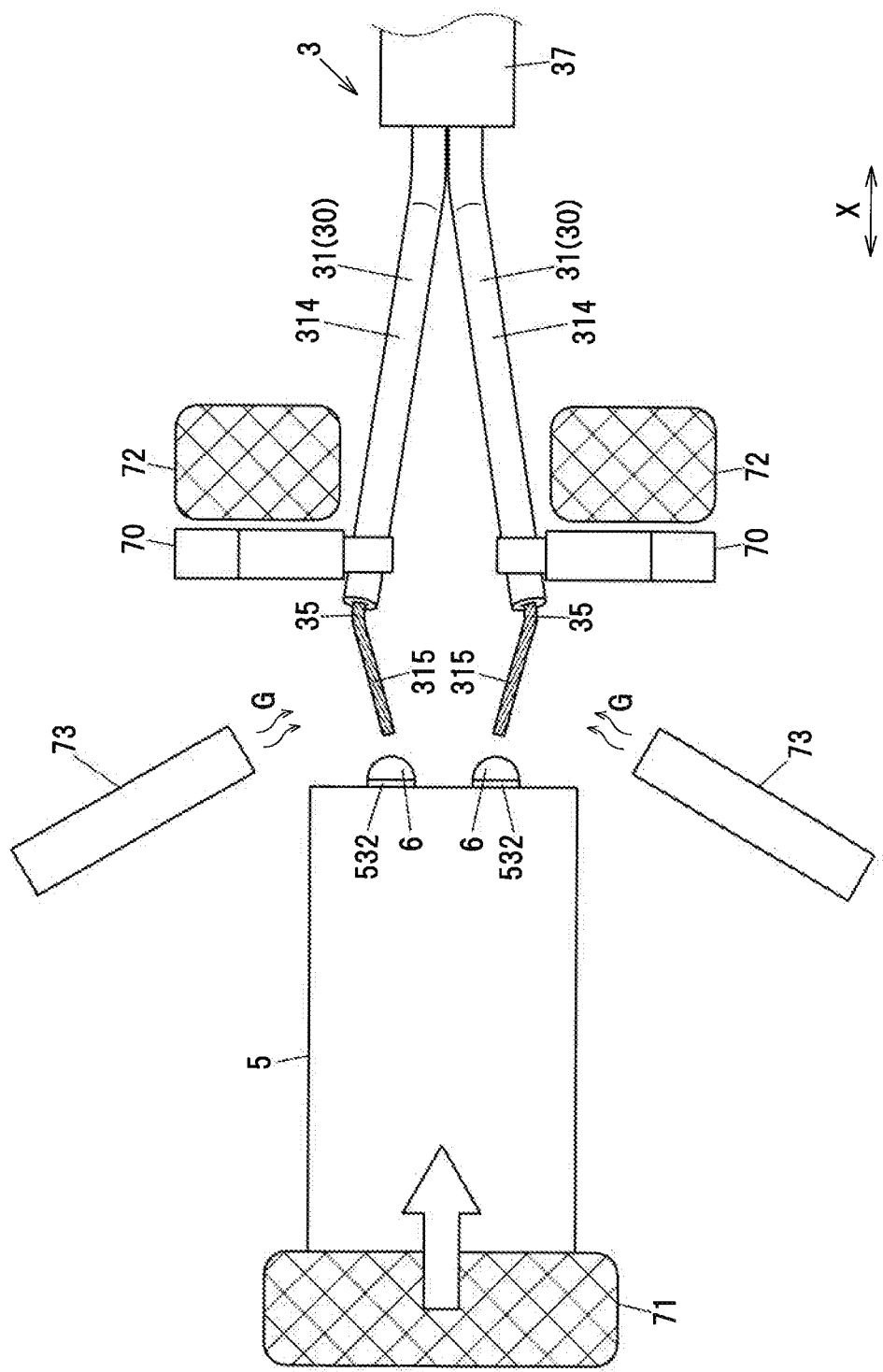
FIG. 16 is a plan view showing a joining step of the cable connection structure in the first embodiment.

FIG. 16 is a plan view of the joining step of the cable connection structure 1. Unlike FIG. 14, FIG. 16 shows that the first heater 71 and the second heaters 72 are hatched, which means that the first heater 71 and the second heaters 72 shown in FIG. 16 are ON-state (heated).

The joining step is performed to solder the electric wire 30 with the electrode 532 after the bending and alignment steps. During the joining step, the first heater 71 and the second heaters 72 are switched on and heated. In the joining step, inert gas G, such as high-temperature nitrogen gas, is blown around the solder 6 by an inert gas introduction section 73. Under these conditions, the imaging device 5 is placed closer to the cable 3 in the X-direction, and the electric wires 30 are inserted into the molten solder 6, and the electric wires 30 are soldered with the electrodes 532. The position of the electric wire 30 in relation to the electrode 532 is adjusted in such a manner that the position of the eccentric boundary 8 between the electric wire 30 and the solder 6 is eccentric radially outwardly with respect to the electrode surface 532s. Furthermore, by blowing a high temperature inert gas G around the solder 6, it is possible to promote the melting of the solder 6 and to suppress the oxidation of the solder 6.

Next, although the drawing is omitted, during the burying step, for example, a material of the buried member 4 in the molten state is filled from the electrode-forming surface 531 to the tip end face 371 of the jacket 37 by the means of a sharp-tipped injector. In this case, if the volume of a space being surrounded by the four electric wires 30 is too small, the molten resin of the buried member 4 having the viscosity cannot be sufficiently supplied into the space being surrounded by the four electric wires 30, and air bubbles may be formed within the buried member 4. In addition, if the filling amount of the material of the buried member 4 in the molten state is low in the burying step, it may be necessary to inject more material of the buried member 4 in the molten state as an additional step. In this case, air is particularly likely to be trapped inside the buried member 4. Therefore, in the four electric wires 30 in the present embodiment, the separating regions 33, which are separated from each other as being distant from the electrode-forming surface 531 in the X-direction, can be formed in the part that is located inside the buried member 4, thereby expanding the space surrounded by the four electric wires 30, thereby suppressing the air bubbles from forming inside the buried member 4.

As described above, it is possible to manufacture the cable connection structure 1 in the present embodiment.

Operations and Effects of the First Embodiment

According to the cable connection structure 1 in the present embodiment, the boundary 8 between the solder 6 and the electric wire 30 is the eccentric boundary 8 which is eccentric with respect to the electrode surface 532s when viewed from the X-direction. The eccentric boundary 8 is eccentric far from at least one other boundary 8, relative to the electrode surface 532s. Therefore, it is possible to increase the distance between the eccentric boundary 8 and at least one other boundary 8, and to increase the distance between the electric wires 30 constituting these boundaries 8. This configuration suppresses the air bubbles from forming in the buried member 4, which is located between the electric wires 30, which are connected to the eccentric boundary 8 and at least one other boundary 8, respectively. If the air bubbles are formed in the buried member 4, for example, the air bubbles expand or contract with the temperature or pressure changes, and the outer pressure is likely to be applied to the connection between the electrode 532 and the electric wire 30. However, it is possible to suppress such problems from occurring in the present embodiment.

The direction in which the center C1 of the eccentric boundary 8 is aligned with the center C2 of the electrode surface 532s when viewed from the X-direction is set as the alignment direction (the radial direction in the present embodiment). Further, in the alignment direction, one side in which the eccentric boundary 8 is eccentric relative to the electrode surface 532s is set as an eccentric side (radially outward side in the present embodiment), while the opposite side of the eccentric side is set as anti-eccentric side (radially inward side in the present embodiment). Here, in the solder 6 constituting the eccentric boundary 8, the width W1 of an anti-eccentric side portion in the alignment direction with respect to the eccentric boundary 8 is greater than the width W2 of an eccentric side portion in the alignment direction with respect to the eccentric boundary 8. This will suppress the excessively low strength of the solder 6 constituting the boundary 8, even if the boundary 8 is eccentric with respect to the electrode surface 532s.

Further, in the cross-section passing through the center C1 of the eccentric boundary 8 and the center C2 of the electrode surface 532s and being parallel to the X-direction, the angle θ1 made between the alignment direction and the first surface 61 of the solder 6 located on the anti-eccentric side with respect to the eccentric boundary 8 is smaller than the angle θ2 between the alignment direction and the second surface 62 of the solder 6 located on the eccentric side with respect to the eccentric boundary 8. The inclination of the first surface 61 makes it easier for the molten resin for forming the buried member 4 to be guided toward the anti-eccentric side (radially inward in the present embodiment) of the solder 6.

In addition, the electric wire 30 constituting the eccentric boundary 8 is a separating wire 300 including the separating region 33 inclined toward the eccentric side as being distant from the electrode-forming surface 531 in the X-direction inside the buried member 4. Therefore, it is possible to increase the space between the separating wire 300 and at least one other electric wire 30, thereby suppressing the formation of air bubbles in the buried member 4 that is injected into the space.

The angle β made between the X-direction and the separating region 33 is 10 degrees or more and 45 degrees or less. The angle β of 10 degrees or more can further increase the space between the separating wire 300 and at least one other electric wire 30. The angle β of 45 degrees or less suppresses the difficulty of entering the molten resin constituting the buried member 4 in the gap due to the narrow gap between the separating region 33 and the electrode-forming surface 531.

The separating wire 300 has the separating region 33 and the approaching region 34. The angle α between the longitudinal direction of the separating region 33 and the longitudinal direction of the approaching region 34 is 3 degrees or more and 15 degrees or less. The small angle α, which is 3 degrees or more and 15 degrees or less, can suppress the difficulty in entry of the molten resin into the gap between the separating region 33 and the approaching region 34, due to the extremely narrow gap between the separating region 33 and the approaching region 34.

Still further, the core wire exposed at the separating wire 300 (i.e., the inner conductor 311) has the bending portion 35, and the portion extending from the bending portion 35 to the electrode 532 in the core wire constitutes the separating region 33. This makes it easy to form the separating region 33 on the separating wire 300.

In addition, the electrodes 532 includes the four electrodes 532 arranged side by side on the virtual circle C. The electric wires 30 include the four electric wires 30 connected to the four electrodes 532. Thus, in the case where the electric wires 30 are arranged in three dimensions, it is concerned that the molten resin for forming the buried member 4 will be difficult to be provided sufficiently in the space surrounded by the electric wires 30. Therefore, in the present embodiment, each of the four boundaries 8 constitutes the eccentric boundary 8, and the eccentric boundary 8 is eccentric radially outwardly in the virtual circle C with respect to the electrode surface 532s. This will allow the space surrounded by the four electric wires 30 to be larger, and it will make it easier for the molten resin for forming the buried member 4 to be filled in the space.

Further, the electronic component 2 is the imaging device 5 equipped with the image sensor 53 for the endoscope. The diameter of each core wire (i.e., the inner conductor 311) of each of the four electric wires 30 is 0.1 mm or less. In other words, the core of each of the four electric wires 30 is an ultrafine conductor, and it is assumed that the imaging device 5 of the endoscope as the electronic component 2 to be connected to the cable 3 should be formed to be very small so that it can be inserted into the human body. In the case of such a prerequisite configuration, the gap between the electric wires 30 is likely to be very narrow, thereby making it difficult for the molten resin for forming the buried member 4 to enter the gap, and increasing the concern that the air bubbles will occur within the buried member 4. Therefore, with the assumption that such a prerequisite configuration is provided, the effect of having the eccentric boundary 8 is remarkable in suppressing the air bubbles from forming within the buried member 4.

In addition, the cable 3 has the jacket 37 that collectively covers the portions of the electric wires 30 except the portions on the side of the electrode-forming surface 531. Therefore, the electric wires 30 are forced to approach each other by the restraining force of the jacket 37. Therefore, without any particular effort, the electric wires 30 are configured to approach each other as being distant from the electrode-forming surface 531, and the volume of the region surrounded by the electric wires 30 is likely to decrease. Therefore, in the present embodiment, even in the situation where the region surrounded by the electric wires 30 is likely to be smaller by having the jacket 37 that covers the electric wires 30 together, it is possible to more effectively suppress the formation of the air bubbles inside the buried member 4 by forming the four electric wires 30 to be separated from each other as being distant from the electrode-forming surface 531.

Also, inside the buried member 4, the conductor-exposed portion 315 of the coaxial wire 31 is shorter than the insulator-exposed portion 314. Although the impedance of the conductor-exposed portion 315 is easily increased due to direct placement of the buried member 4 around the conductor-exposed portion 315, the increase in impedance of the coaxial wire 31 can be suppressed by shortening the conductor-exposed portion 315. Also, by lengthening the insulator-exposed portion 314, it is easy to hold the insulator-exposed portion 314 during the alignment step described above.

In the X-direction, the buried member 4 is arranged from the electrode-forming surface 531 to the jacket 37. The four separating wires 300 have the separating regions 33, which are separated from each other as being distant from the electrode-forming surface 531 toward the jacket 37, and the approaching regions 34, which are closer to each other as being distant from the separating region 33 toward the jacket 37, inside the buried member 4. Therefore, the region surrounded by the four separating wires 300 becomes larger as they approach each other in the X-direction, and so they are formed symmetrically in the X-direction. This makes it easier for the molten resin for forming the buried member 4 to be filled in the space surrounded by the four separating wires 300, thereby preventing the air bubbles from forming inside the buried member 4.

In addition, the three coaxial wires 31 are configured in such a manner that the approaching region 34 is composed of a coated wire portion (i.e., the insulator-exposed portion) comprising the core wire (i.e., inner conductor 311) of the electric wire 30 which is covered by an insulator (i.e., inner insulator 312), and the separating region 33 is composed of a bare wire portion of the core wire exposed from the insulator (i.e., conductor-exposed portion 315). The separating region 33 is close to the connection between the electric wire 30 and the electrode 532. The separating region 33 is a portion which may increase the stress generated at the connection due to the formation of air bubbles in the buried member 4. By forming such a portion from the bare wire, it will be easy to ensure a distance between the separating regions 33, and to suppress the air bubbles from forming in the region between the separating regions 33 within the buried member 4. And, the approaching region 34 of each of the three coaxial wires 31 is composed of the coated wire portion, which makes it easier to ensure electrical insulation between the approaching regions 34 of the electric wires 30.

In addition, the three coaxial wires 31 are bent at the opposite ends of the bare wire portions with respect to the electrodes 532, and the distal end regions (i.e., the separating regions 33) with respect to the bending portions 35 in the coaxial wires 31 are formed to be straight line. The boundary between the bare wire portion and the coated wire portion and the bending portion 35 of the electric wire 30 are likely to become regions where the flow of the molten resin for forming the buried member 4 is easily stagnated. By concentrating such regions in one place and making the separating regions 33 to be straight, it will become easy to suppress the formation of the air bubbles within the buried member 4.

Also, when viewed from the X-direction, the buried member 4 is located inside the outer periphery of the electrode-forming surface 531. This effectively suppresses the increase in size of the cable connection structure 1. In other words, in the present embodiment, if the four electric wires 30 are provided with the portions configured to be separated from each other as being distant from the electrode-forming surface 531 in the X-direction, unless otherwise specified, the peripheral parts of said portions would protrude outside the forming surface of the electric wires 30 when viewed from the X-direction. It may cause the interference with other parts. Therefore, in the present embodiment, the buried member 4 is formed in such a manner that the buried member 4 is located inside the outer periphery of the electrode-forming surface 531 when viewed from the X-direction. Accordingly, even if the four electric wires 30 are provided with the portions configured to be separated from each other as being distant from the electrode-forming surface 531 in the X-direction, it is possible to suppress the buried member 4 from protruding outside the electrode-forming surface 531 when viewed from the X-direction, thus suppressing the interference between the cable 3 and other parts.

Further, the core wire of each of the four electric wires 30 is composed of a twisted wire. Therefore, it can effectively improve the productivity of the cable connection structure 1. In other words, as in this configuration, if the four electric wires 30 include the portions configured to be separated from each other as being distant from the electrode-forming surface 531 in the X-direction inside the buried member 4, it will be highly difficult to align the tip end of each electric wire with the corresponding electrode 532. By forming the core wire of each of the four electric wires 30 from the twisted wire having a high flexibility, it will be easier to align the tip end of each electric wire 30 with the electrode 532.

As described above, according to the present embodiment, it is possible to provide a cable connection structure that facilitates suppressing the formation of the air bubbles in the buried member.

Second Embodiment

Figure 17:
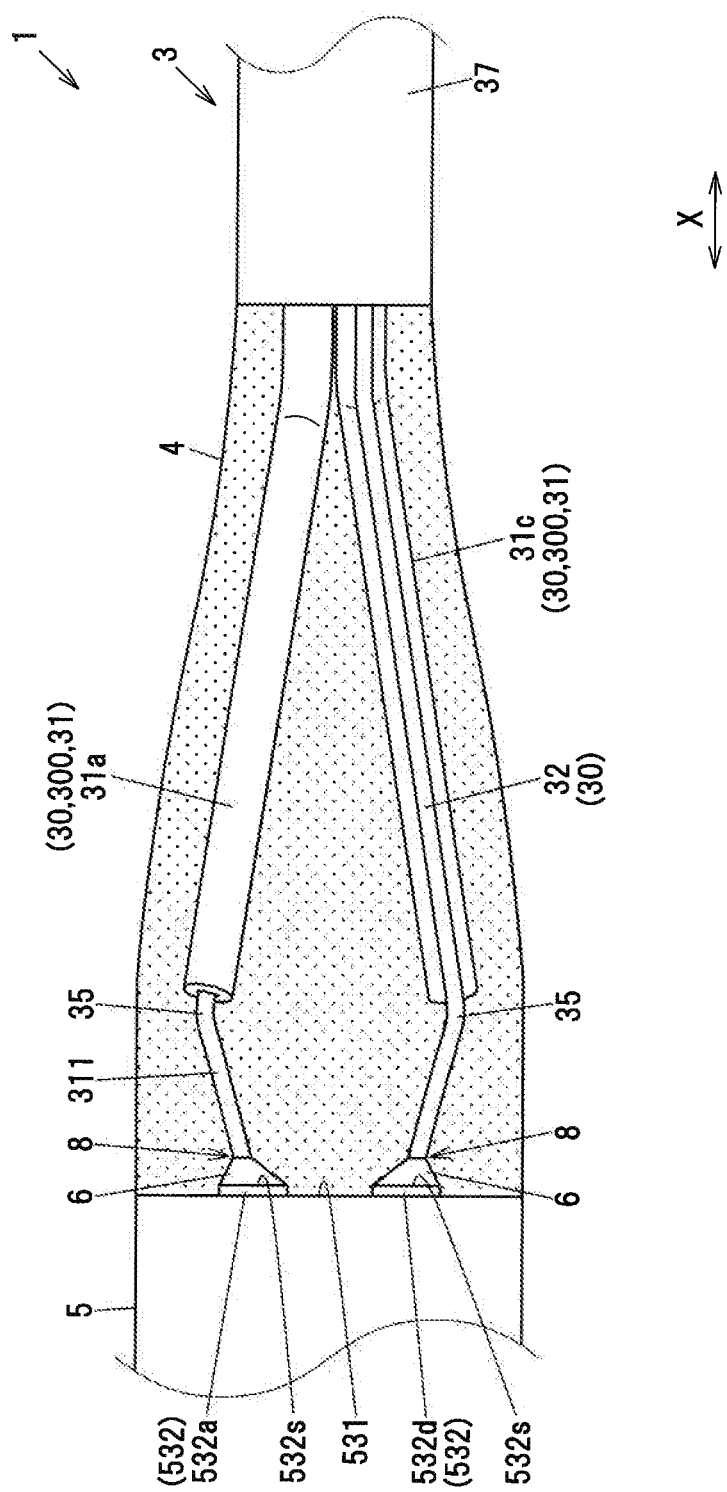
FIG. 17 is an enlarged side view showing a peripheral part of the connection between the cable and the imaging device in the cable connection structure in the second embodiment.

FIG. 17 is an enlarged side view showing a peripheral part of the connection between the cable 3 and the imaging device 5 in the cable connection structure 1 in the second embodiment. In the present embodiment, all the core wires of the four electric wires 30 are composed of single wires. In the present embodiment, the inner conductors 311 of the three coaxial wires 31 and one drain wire 32 are each composed of single wires.

The other configurations of the second embodiment are similar to the first embodiment except the aforementioned feature.

Note that any sign used in the second embodiment that is identical to the one used in the first embodiment represents a similar component, etc., in the first embodiment, unless otherwise indicated.

Operations and Effects of the Second Embodiment

In the present embodiment, the core wire of each of the four electric wires 30 is a single wire. Therefore, it is easy to maintain a portion from the bending portion 35 to the electrode 532 of the core wire in a straight line, which makes it easier to align the electric wires 30 with the corresponding electrodes 532. In addition, the core wire is surrounded by the buried member 4. By forming the core wire from a single wire, it is possible to suppress the formation of small convexity around the core wire, which makes it easier to suppress the air bubbles from leaving inside the buried member 4.

The second embodiment achieves similar operations and effects to those of the first embodiment.

Summary of the Embodiments

Technical ideas understood from the embodiment will be described below citing the reference signs, etc., used for the embodiments. However, each reference sign, etc., described below is not intended to limit the constituent elements in the claims to the members, etc., specifically described in the embodiments.

[1] A cable connection structure 1, comprising:
an electronic component 2 including electrodes 532 on an electrode-forming surface 531;
a cable 3 including electric wires 30 connected to the electrodes 532 respectively; and
a buried member 4 being formed by curing a molten resin filled around the electric wires 30, and being embedded with the electric wires 30, wherein at least three electric wires 30 of the electric wires 30 are separating wires 300 including separating regions 33 being separated from each other in the normal direction X as being distant from the electrode-forming surface 531, wherein the electrodes 532 includes at least three electrodes 532 arranged side by side on a virtual circle C, wherein the electric wires 30 include at least three separating wires 300 connected to the at least three electrodes 532, wherein the separating regions 33 of the at least three separating wires 300 are provided to be located eccentric radially outwardly in the virtual circle C as being distant from the electrode surface 532s in the normal direction X of the electrode-forming surface 531, and wherein an angle β between the separating region 33 and the normal direction X of the electrode-forming surface 531 is 10 degrees or more and 45 degrees or less.

[2] The cable connection structure 1 as described in [1], wherein the separating wire 300 is connected to the electrode 532 via a solder 6, and wherein the separating wire 300 includes a solder-side end at a portion exposed from the solder 6 and the solder-side end is located radially outwardly in the virtual circle C with respect to a center of the electrode 532.

[3] The cable connection structure 1 as described in [1] or [2], wherein the at least three separating wires 300 include approaching regions 34 being closer to each other as being distant from the separating region 33 toward an opposite side with respect to the electrode-forming surface 531 in the normal direction X of the electrode-forming surface 531, and wherein an angle α between a longitudinal direction of the separating region 33 and a longitudinal direction of the approaching region 34 is 3 degrees or more and 15 degrees or less.

[4] The cable connection structure 1 as described in any one of [1] to [3], wherein the electrode 532 includes four electrodes 532 arranged in four positions that are configured as vertices of a square, wherein the at least three separating wires 300 include four separating wires 300 connected to the four electrodes 532 respectively, and wherein the separating regions 33 of the four separating wires 300 are provided along diagonals of the square.

[5] The cable connection structure 1 as described in any one of [1] to [4], wherein a core wire exposed at the separating wire 300 includes a bending portion 35, and a portion extending from the bending portion 35 to the electrode 532 in the core wire constitutes the separating region 33.

[6] The cable connection structure 1 as described in any one of [1] to [5], wherein the cable 3 includes a jacket 37 that collectively covers portions of the electric wires 30 except portions on the side of the electrode-forming surface 531.

[7] The cable connection structure 1 as described in [6], wherein each of the at least three separating wires 300 includes a coaxial wire 31 including an inner conductor 311 to be connected to the electrode 532, an inner insulator 312 covering an outer circumference of the inner conductor 311, and an outer conductor 313 covering an outer circumference of the inner insulator 312, wherein the coaxial wire 31 further includes an insulator-exposed portion 314 in which the inner insulator 312 is exposed from the outer conductor 313 and the jacket 37, and a conductor-exposed portion in which an end to be connected to the electrode 532 of the inner conductor 311 is exposed from the inner insulator 312, and wherein the conductor-exposed portion 315 is shorter than the insulator-exposed portion 314.

[8] The cable connection structure 1 as described in [6] or [7], wherein the buried member 4 is provided from the electrode-forming surface 531 to the jacket 37, wherein the at least three separating wires 300 include the separating regions 33 being separated from each other as being distant from the electrode-forming surface 531 toward the jacket 37 and approaching regions 34 being closer to each other as being distant from the separating region 33 toward the jacket 37 inside the buried member 4.

[9] The cable connection structure 1 as described in [8], wherein each of the at least three separating wires 300 includes, at a region exposed from the jacket 37, a coated wire portion comprising the core wire of the electric wire 30 which is covered by an insulator, and a bare wire portion in which the core wire of the electric wire 30 is exposed from the insulator, and wherein the coated wire portion constitutes the approaching region 34 while the bare wire portion constitutes the separating region 33.

[10] The cable connection structure 1 as described in any one of [6] to [9], wherein each of the at least three separating wires 300 includes, at a region exposed from the jacket 37, a coated wire portion comprising the core wire of the electric wire 30 which is covered by an insulator, and a bare wire portion in which the core wire of the electric wire 30 is exposed from the insulator, and wherein an opposite end portion with respect to the electrode 532 in the bare wire portion constitutes a bending portion 35, while a portion extending from the bending portion 35 to the electrode 532 in the core wire is formed in a straight line.

[11] The cable connection structure 1 as described in any one of [1] to [10], wherein when viewed from the normal direction X of the electrode-forming surface 531, an outer periphery of the buried member 4 is located at a same position as an outer periphery of the electrode-forming surface 531, or inside the outer periphery of the electrode-forming surface 531.

[12] The cable connection structure 1 as described in any one of [1] to [11], wherein a diameter of each core wire of the electric wires 30 is 0.1 mm or less, and wherein the electronic component 2 is an imaging device 5 equipped with an image sensor 53 for an endoscope.

[13] A cable connection structure 1, comprising:
an electronic component 2 including electrodes 532 on an electrode-forming surface 531;
solders 6 provided on each electrode surface 532s of the electrodes 532;
a cable 3 including electric wires 30 connected to the solders 6 respectively; and
a buried member 4 being formed by curing a molten resin filled around the solders 6 and the electric wires 30, and being embedded with the solders 6 and the electric wires 30, wherein a boundary 8 between the solder 6 and the electric wire 30 is an eccentric boundary 8 that is eccentric with respect to the electrode surface 532s when viewed from a normal direction X of the electrode-forming surface 531, wherein the eccentric boundary 8 is eccentric with respect to the electrode surface 532s to be distant from at least one of other boundaries 8, wherein a direction in which a center C1 of the eccentric boundary 8 is aligned with a center C2 of the electrode surface 532s when viewed from the normal direction is an alignment direction, one side of the alignment direction in which is the eccentric boundary 8 is eccentric with respect to the electrode surface 532s is an eccentric side, and an opposite side to the eccentric side is an anti-eccentric side, wherein the solder 6 constituting the eccentric boundary 8 is configured in such a manner that a width W1 in the alignment direction of a portion on the anti-eccentric side with respect to the eccentric boundary 8 is greater than a width W2 in the alignment direction of a portion on the eccentric side with respect to the eccentric boundary 8.

[14] The cable connection structure 1 as described in [13], wherein, in a cross-section passing through the center C1 of the eccentric boundary 8 and the center C2 of the electrode surface 532s and being parallel to the normal direction X, an angle θ1 made between the alignment direction and a first surface 61 of the solder 6 being located on the anti-eccentric side with respect to the eccentric boundary 8 is smaller than an angle θ2 made between the alignment direction and a second surface 62 of the solder 6 being located on the eccentric side with respect to the eccentric boundary 8.

[15] The cable connection structure 1 as described in [13] or [14], wherein the electric wire 30 constituting the eccentric boundary 8 is a separating wire 300 including a separating region 33 inside the buried member, and the separating region 33 is inclined toward the eccentric side in the normal direction X as being distant from the electrode-forming surface 531.

[16] The cable connection structure 1 as described in [15], wherein an angle β between the separating region 33 and the normal direction X is 10 degrees or more and 45 degrees or less.

[17] The cable connection structure 1 as described in [15] or [16], wherein the separating wire 300 includes an approaching region 34 being closer to the anti-eccentric side in the normal direction X as being distant from the separating region 33 toward an opposite side with respect to the electrode-forming surface 531, and wherein an angle α between a longitudinal direction of the separating region 33 and a longitudinal direction of the approaching region 34 is 3 degrees or more and 15 degrees or less.

[18] The cable connection structure 1 as described in any one of [15] to [17], wherein a core wire exposed at the separating wire 300 includes a bending portion 35, and a portion extending from the bending portion 35 to the electrode 532 in the core wire constitutes the separating region 33.

[19] The cable connection structure 1 as described in any one of [13] to [18], wherein the electrodes 532 includes at least three electrodes 532 arranged side by side on a virtual circle C, wherein the electric wires 30 include at least three electric wires 30 connected to the at least three electrodes 532, wherein each of at least three boundaries 8 between the at least three electrodes 532 and the at least three electric wires 30 constitutes the eccentric boundary 8, and wherein the eccentric boundary 8 is eccentric radially outwardly in the virtual circle C with respect to the electrode surface 532s.

[20] The cable connection structure 1 as described in any one of [13] to [19], wherein the electronic component 2 comprises an imaging device 5 including an image sensor 53 for an endoscope, wherein a diameter of each core wire of the electric wires 30 is 0.1 mm or less.

Although the first and second embodiments of the invention has been described, the invention according to claims is not to be limited to the embodiments described above. Further, please note that not all combinations of the features described in the embodiment are necessary to solve the problem of the invention. The invention can also be enforced by its modification and variation as necessity without deviating from its intended purpose.

For example, in each embodiment, four electrodes are formed on the electrode-forming surface, but depending on the specification of the endoscopic device, for example, two, three, or five or more electrodes can be formed. In response to the number of the electrodes, electric wires may also be two, three or five or more.

In each embodiment, all four boundaries are made as eccentric boundaries, However, the present invention is not limited thereto. There should be at least one eccentric boundary. In each embodiment, an example in which the eccentric boundary is eccentric far from all other boundaries with respect to the electrode surface is described. However, the present invention is not limited thereto. The eccentric boundary should be eccentric far from at least one other boundary with respect to the electrode surface.

Also, in each embodiment, all the four electric wires are provided as the separating wires including the portions configured to be separated from each other as being distant from the electrode-forming surface in the normal direction of the electrode-forming surface inside the buried member. However, the present invention is not limited thereto. There should be at least two separating wires inside the buried member. If at least two separating wires are provided, it is possible to increase the region between the separating wires in the buried member, thereby suppressing the formation of air bubbles in the buried member.

In each embodiment, the separating region and the approaching region are formed in the region which is exposed from the jacket of the separating wire. The separating region should be formed in multiple electric wires. For example, the approaching regions of the four electric wires in each embodiment can be formed in parallel to each other. It is also possible to have all the parts of the four electric wires protruding from the jacket as the separating regions.

In each embodiment, the buried member is formed from the electrode-forming surface to the tip end face of the jacket, but the present invention is not limited thereto. For example, in each embodiment, the position of the end closer to the jacket of the buried member may be distant from the tip end face of the jacket toward the electrode-forming surface.

The invention claimed is:

1. A cable connection structure, comprising:
an electronic component including electrodes on an electrode-forming surface;
a cable including electric wires connected to the electrodes respectively; and
a buried member being formed by curing a molten resin filled around the electric wires, and being embedded with the electric wires,
wherein at least three electric wires of the electric wires are separating wires including separating regions being separated from each other in the normal direction as being distant from the electrode-forming surface,
wherein the electrodes include at least three electrodes arranged side by side on a virtual circle,
wherein the electric wires include at least three separating wires connected to the at least three electrodes, wherein the separating regions of the at least three separating wires are provided to be located eccentric radially outwardly in the virtual circle as being distant from the electrode surface in the normal direction of the electrode-forming surface, and wherein an angle between the separating region and the normal direction of the electrode-forming surface is 10 degrees or more and 45 degrees or less.

2. The cable connection structure according to claim 1, wherein the separating wire is connected to the electrode via a solder, and wherein the separating wire includes a solder-side end at a portion exposed from the solder and the solder-side end is located radially outwardly in the virtual circle with respect to a center of the electrode.

3. The cable connection structure according to claim 1, wherein the at least three separating wires include approaching regions being closer to each other as being distant from the separating region toward an opposite side with respect to the electrode-forming surface in the normal direction of the electrode-forming surface, and wherein an angle between a longitudinal direction of the separating region and a longitudinal direction of the approaching region is 3 degrees or more and 15 degrees or less.

4. The cable connection structure according to claim 1, wherein the electrode includes four electrodes arranged in four positions that are configured as vertices of a square, wherein the at least three separating wires include four separating wires connected to the four electrodes respectively, and wherein the separating regions of the four separating wires are provided along diagonals of the square.

5. The cable connection structure according to claim 1, wherein a core wire exposed at the separating wire includes a bending portion, and a portion extending from the bending portion to the electrode in the core wire constitutes the separating region.

6. The cable connection structure according to claim 1, wherein the cable includes a jacket that collectively covers portions of the electric wires except portions on the side of the electrode-forming surface.

7. The cable connection structure according to claim 6, wherein each of the at least three separating wires includes a coaxial wire including an inner conductor to be connected to the electrode, an inner insulator covering an outer circumference of the inner conductor, and an outer conductor covering an outer circumference of the inner insulator, wherein the coaxial wire further includes an insulator-exposed portion in which the inner insulator is exposed from the outer conductor and the jacket, and a conductor-exposed portion in which an end to be connected to the electrode of the inner conductor is exposed from the inner insulator, and wherein the conductor-exposed portion is shorter than the insulator-exposed portion.

8. The cable connection structure according to claim 6, wherein the buried member is provided from the electrode-forming surface to the jacket, wherein the at least three separating wires include the separating regions being separated from each other as being distant from the electrode-forming surface toward the jacket and approaching regions being closer to each other as being distant from the separating region toward the jacket inside the buried member.

9. The cable connection structure according to claim 8, wherein each of the at least three separating wires includes, at a region exposed from the jacket, a coated wire portion comprising the core wire of the electric wire which is covered by an insulator, and a bare wire portion in which the core wire of the electric wire is exposed from the insulator, and wherein the coated wire portion constitutes the approaching region while the bare wire portion constitutes the separating region.

10. The cable connection structure according to claim 6, wherein each of the at least three separating wires includes, at a region exposed from the jacket, a coated wire portion comprising the core wire of the electric wire which is covered by an insulator, and a bare wire portion in which the core wire of the electric wire is exposed from the insulator, and wherein an opposite end portion with respect to the electrode in the bare wire portion constitutes a bending portion, while a portion extending from the bending portion to the electrode in the core wire is formed in a straight line.

11. The cable connection structure according to claim 1, wherein when viewed from the normal direction of the electrode-forming surface, an outer periphery of the buried member is located at a same position as an outer periphery of the electrode-forming surface, or inside the outer periphery of the electrode-forming surface.

12. The cable connection structure according to claim 1, wherein a diameter of each core wire of the electric wires is 0.1 mm or less, and wherein the electronic component is an imaging device equipped with an image sensor for an endoscope.

13. A cable connection structure, comprising:
an electronic component including electrodes on an electrode-forming surface;
solders provided on each electrode surface of the electrodes;
a cable including electric wires connected to the solders respectively; and
a buried member being formed by curing a molten resin filled around the solders and the electric wires, and being embedded with the solders and the electric wires,
wherein a boundary between the solder and the electric wire is an eccentric boundary that is eccentric with respect to the electrode surface when viewed from a normal direction of the electrode-forming surface,
wherein the eccentric boundary is eccentric with respect to the electrode surface to be distant from at least one of other boundaries,
wherein a direction in which a center of the eccentric boundary is aligned with a center of the electrode surface when viewed from the normal direction is an alignment direction, one side of the alignment direction in which is the eccentric boundary is eccentric with respect to the electrode surface is an eccentric side, and an opposite side to the eccentric side is an anti-eccentric side,
wherein the solder constituting the eccentric boundary is configured in such a manner that a width in the alignment direction of a portion on the anti-eccentric side with respect to the eccentric boundary is greater than a width in the alignment direction of a portion on the eccentric side with respect to the eccentric boundary.

14. The cable connection structure according to claim 13, wherein, in a cross-section passing through the center of the eccentric boundary and the center of the electrode surface and being parallel to the normal direction, an angle made between the alignment direction and a first surface of the solder being located on the anti-eccentric side with respect to the eccentric boundary is smaller than an angle made between the alignment direction and a second surface of the solder being located on the eccentric side with respect to the eccentric boundary.

15. The cable connection structure according to claim 13, wherein the electric wire constituting the eccentric boundary is a separating wire including a separating region inside the buried member, and the separating region is inclined toward the eccentric side in the normal direction as being distant from the electrode-forming surface.

16. The cable connection structure according to claim 15, wherein an angle between the separating region and the normal direction is 10 degrees or more and 45 degrees or less.

17. The cable connection structure according to claim 15, wherein the separating wire includes an approaching region being closer to the anti-eccentric side in the normal direction as being distant from the separating region toward an opposite side with respect to the electrode-forming surface, and wherein an angle α between a longitudinal direction of the separating region and a longitudinal direction of the approaching region is 3 degrees or more and 15 degrees or less.

18. The cable connection structure according to claim 15, wherein a core wire exposed at the separating wire includes a bending portion, and a portion extending from the bending portion to the electrode in the core wire constitutes the separating region.

19. The cable connection structure according to claim 13, wherein the electrodes includes at least three electrodes arranged side by side on a virtual circle, wherein the electric wires include at least three electric wires connected to the at least three electrodes, wherein each of at least three boundaries between the at least three electrodes and the at least three electric wires constitutes the eccentric boundary, and wherein the eccentric boundary is eccentric radially outwardly in the virtual circle with respect to the electrode surface.

20. The cable connection structure according to claim 13, wherein the electronic component comprises an imaging device including an image sensor for an endoscope, wherein a diameter of each core wire of the electric wires is 0.1 mm or less.

* * * * *